(12) United States Patent
Yang

(10) Patent No.: US 11,482,434 B2
(45) Date of Patent: Oct. 25, 2022

(54) SYSTEMS AND METHODS FOR WORKPIECE PROCESSING

(71) Applicants: Mattson Technology, Inc., Fremont, CA (US); Beijing E-Town Semiconductor Technology, Co., LTD, Beijing (CN)

(72) Inventor: Michael Yang, Palo Alto, CA (US)

(73) Assignees: BELTING E-TOWN SEMICONDUCTOR TECHNOLOGY CO., LTD, Beijing (CN); MATTSON TECHNOLOGY, INC., Fremont, CA (US)

( * ) Notice: Subject to any disclaimer, the term of this patent is extended or adjusted under 35 U.S.C. 154(b) by 0 days.

(21) Appl. No.: 17/191,295

(22) Filed: Mar. 3, 2021

(65) Prior Publication Data

US 2021/0193489 A1    Jun. 24, 2021

Related U.S. Application Data

(63) Continuation-in-part of application No. 16/782,110, filed on Feb. 5, 2020, now Pat. No. 11,257,696, which
(Continued)

(51) Int. Cl.
    H01L 21/67     (2006.01)
    H01L 21/677    (2006.01)

(52) U.S. Cl.
    CPC .. H01L 21/67167 (2013.01); H01L 21/67201 (2013.01); H01L 21/67742 (2013.01)

(58) Field of Classification Search
    CPC ......... H01L 21/67167; H01L 21/67201; H01L 21/67742; H01L 21/67196
    See application file for complete search history.

(56) References Cited

U.S. PATENT DOCUMENTS

| 4,990,047 A | 2/1991 | Wagner |
| 5,376,862 A | 12/1994 | Stevens |

(Continued)

FOREIGN PATENT DOCUMENTS

| CN | 111926306 B | 11/2020 |
| CN | 112701038 A | 4/2021 |

(Continued)

OTHER PUBLICATIONS

PCT International Search Report & Written Opinion for corresponding PCT Application No. PCT/2017/055460, dated Jan. 22, 2018—23 pages.

(Continued)

*Primary Examiner* — Glenn F Myers
(74) *Attorney, Agent, or Firm* — Dority & Manning, P.A.

(57) ABSTRACT

A processing system for processing a plurality of workpieces includes a transfer chamber in process flow communication with a first processing chamber and a second processing chamber, the transfer chamber having a first straight side, wherein the first process chamber includes at least one first processing station, and wherein the first processing chamber is disposed along the first straight side, wherein the second process chamber includes at least two second processing stations, wherein the second processing chamber is disposed along the first straight side, and wherein the second process chamber disposed in linear arrangement with the first process chamber along the first straight side, and wherein the transfer chamber includes at least one workpiece handling robot configured to transfer at least one workpiece to the at least one first processing station and the at least two second processing stations.

20 Claims, 18 Drawing Sheets

Related U.S. Application Data is a continuation of application No. 15/726,437, filed on Oct. 6, 2017, now Pat. No. 10,580,672.

(60) Provisional application No. 62/409,538, filed on Oct. 18, 2016.

(56) References Cited

U.S. PATENT DOCUMENTS

| | | | |
|---|---|---|---|
| 5,909,994 | A | 6/1999 | Blum et al. |
| 6,071,055 | A | 6/2000 | Tepman |
| 6,450,750 | B1* | 9/2002 | Heyder .............. H01L 21/67778 |
| | | | 414/217 |
| 7,959,403 | B2 | 6/2011 | Van der Meulen |
| 8,007,218 | B2 | 8/2011 | Park et al. |
| 8,016,537 | B2 | 9/2011 | Watanabe et al. |
| 8,430,620 | B1* | 4/2013 | Blank .............. H01L 21/67742 |
| | | | 414/217 |
| 8,538,573 | B2 | 9/2013 | Nakata et al. |
| 9,202,733 | B2 | 12/2015 | Hosek |
| 9,502,275 | B1 | 11/2016 | Trussell et al. |
| 10,113,236 | B2 | 10/2018 | Khan et al. |
| 10,204,810 | B2 | 2/2019 | Hoey |
| 2001/0016157 | A1 | 8/2001 | Sundar |
| 2002/0170671 | A1 | 11/2002 | Matsushita et al. |
| 2003/0123971 | A1 | 7/2003 | Koyama |
| 2004/0118694 | A1* | 6/2004 | Yang ............... H01L 21/76877 |
| | | | 257/E21.585 |
| 2005/0005847 | A1 | 1/2005 | Hiroki |
| 2005/0111956 | A1 | 5/2005 | Van Der Meulen |
| 2006/0039781 | A1 | 2/2006 | Niewmierzycki et al. |
| 2006/0045664 | A1 | 3/2006 | Niewmierzycki et al. |
| 2006/0182529 | A1 | 8/2006 | Hiroki |
| 2007/0292244 | A1* | 12/2007 | Moore .............. H01L 21/67201 |
| | | | 414/217 |
| 2008/0008569 | A1 | 1/2008 | Seol |
| 2008/0085173 | A1 | 4/2008 | Van Der Meulen et al. |
| 2008/0105201 | A1 | 5/2008 | Ronan |
| 2008/0175694 | A1* | 7/2008 | Park ............... H01L 21/67742 |
| | | | 414/217.1 |
| 2009/0191030 | A1 | 7/2009 | Bluck et al. |
| 2011/0135427 | A1 | 6/2011 | Sakaue |
| 2013/0135784 | A1 | 5/2013 | Kao et al. |
| 2013/0183121 | A1 | 7/2013 | Isomura et al. |
| 2014/0099176 | A1 | 4/2014 | Nogi et al. |
| 2014/0174354 | A1* | 6/2014 | Arai ................. H01L 21/67196 |
| | | | 118/728 |
| 2014/0262038 | A1* | 9/2014 | Wang ................ H01L 21/67253 |
| | | | 156/345.35 |
| 2014/0271054 | A1 | 9/2014 | Weaver |
| 2014/0271083 | A1 | 9/2014 | Caveney |
| 2015/0098790 | A1 | 4/2015 | Wakabayashi |
| 2016/0293467 | A1* | 10/2016 | Caveney ........... H01L 21/67742 |
| 2017/0057094 | A1 | 3/2017 | Nishino |
| 2017/0098555 | A1* | 4/2017 | Gouk ................ H01L 21/67034 |
| 2017/0110351 | A1* | 4/2017 | Trussell ........... H01L 21/67742 |
| 2018/0082881 | A1 | 3/2018 | Nagakubo |
| 2018/0166295 | A1 | 6/2018 | Huang |
| 2020/0161162 | A1 | 5/2020 | Yang et al. |

FOREIGN PATENT DOCUMENTS

| | | |
|---|---|---|
| EP | 1684951 | 5/2014 |
| JP | 2008-135630 | 6/2008 |
| JP | 2009-050986 | 3/2009 |
| JP | 2009260252 | 11/2009 |
| JP | 2011243601 | 12/2011 |
| JP | 2012069658 | 4/2012 |
| JP | 2012-186389 | 9/2012 |
| JP | 2013115393 | 6/2013 |
| JP | 2013171872 | 9/2013 |
| KR | 20050072621 | 7/2005 |
| KR | 20070008533 | 1/2007 |
| KR | 20080004118 A | 1/2008 |
| KR | 20080062220 | 7/2008 |
| KR | 20100089314 | 8/2010 |
| KR | 20120015987 | 2/2012 |
| WO | WO 2015057959 | 4/2015 |

OTHER PUBLICATIONS

International Preliminary Report on Patentability for corresponding PCT Application No. PCT/2017/055460, dated Apr. 23, 2019—16 pages.

International Search Report and Written Opinion for Application No. PCT/US2022/018667, dated May 31, 2022, 14 pages.

* cited by examiner

SYSTEMS AND METHODS FOR WORKPIECE PROCESSING

CROSS-REFERENCE TO RELATED APPLICATIONS

The present application is a continuation-in-part of U.S. application Ser. No. 16/782,110 having a filing date of Feb. 5, 2020, entitled "Systems and Methods for Workpiece Processing," which is a continuation of U.S. application Ser. No. 15/726,437 having a filing date of Oct. 6, 2017, entitled "Systems and Methods for Workpiece Processing," which claims the benefit of U.S. Provisional Application No. 62/409,538 filed Oct. 18, 2016, entitled "Systems for Workpiece Processing." Applicant claims priority to and the benefit of each of such applications and incorporates all such applications herein by reference in their entirety.

FIELD

The present disclosure relates generally to processing workpieces and more particularly to systems for processing workpieces, such as semiconductor workpieces.

BACKGROUND

Processing systems which expose workpieces such as, semiconductor wafers or other suitable substrates, to an overall treatment regimen for forming semiconductor devices or other devices can perform a plurality of treatment steps, such as plasma processing (e.g., strip, etch, etc.), thermal treatment (e.g. annealing), deposition (e.g., chemical vapor deposition), etc. To carry out these treatment steps, a system may include one or more robots to move workpieces a number of different times, for example, into the system, between various process chambers, and out of the system. An important consideration in any semiconductor processing system is footprint size of the system. Increased footprint size can take up more space in processing facilities, leading to reduced throughput and increased costs.

Example configurations of processing systems for semiconductor workpieces can include cluster-style tools, carousel-style tools, etc. In cluster-style tools, a plurality of semiconductor processing modules can be arranged around a central robot for moving workpieces among the plurality of process chambers. Cluster-style tools can have a large footprint (e.g., take up a large amount of space) and can only support a limited number of process chambers. In carousel-style tools, workpieces can be rotated among a plurality of process stations. Carousel-style tools can suffer from reduced process integration flexibility and can be difficult to implement in conjunction with cluster configurations.

SUMMARY

Aspects and advantages of embodiments of the present disclosure will be set forth in part in the following description, or may be learned from the description, or may be learned through practice of the embodiments.

One example aspect of the present disclosure is directed to a processing system for processing a plurality of workpieces. The processing chamber includes a transfer chamber in process flow communication with a first processing chamber and a second processing chamber, the transfer chamber having a first straight side, wherein the first process chamber includes at least one first processing station, and wherein the first processing chamber is disposed along the first straight side, wherein the second process chamber includes at least two second processing stations, wherein the second processing chamber is disposed along the first straight side, and wherein the second process chamber disposed in linear arrangement with the first process chamber along the first straight side, and wherein the transfer chamber includes at least one workpiece handling robot configured to transfer at least one workpiece to the at least one first processing station and the at least two second processing stations.

Another example aspect of the present disclosure is directed to a processing system for processing a plurality of workpieces. The processing system includes a first process chamber having two processing stations, a second process chamber having two processing stations, a third process chamber having one processing station, and a transfer chamber in process flow communication with the first process chamber, the second process chamber, and the third process chamber, wherein the first process chamber is disposed on a first side of the transfer chamber, wherein the second process chamber is disposed on a second side of the transfer chamber, the second side of the transfer chamber being opposite the first side of the transfer chamber, and wherein the third process chamber is disposed on a third side of the transfer chamber, the third side of the transfer chamber being perpendicular to the first side and the second side of the transfer chamber.

Another example aspect of the present disclosure is directed to a processing system for processing a plurality of workpieces. The processing system includes a first process chamber having at least one processing station, a second process chamber having at least two processing stations, and a frond end portion in process flow communication with the first process chamber and the second process chamber, wherein the first process chamber and the second process chamber are disposed on a first straight side of the front end portion.

Other example aspects of the present disclosure are directed to systems, methods, and apparatus for processing semiconductor workpieces.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
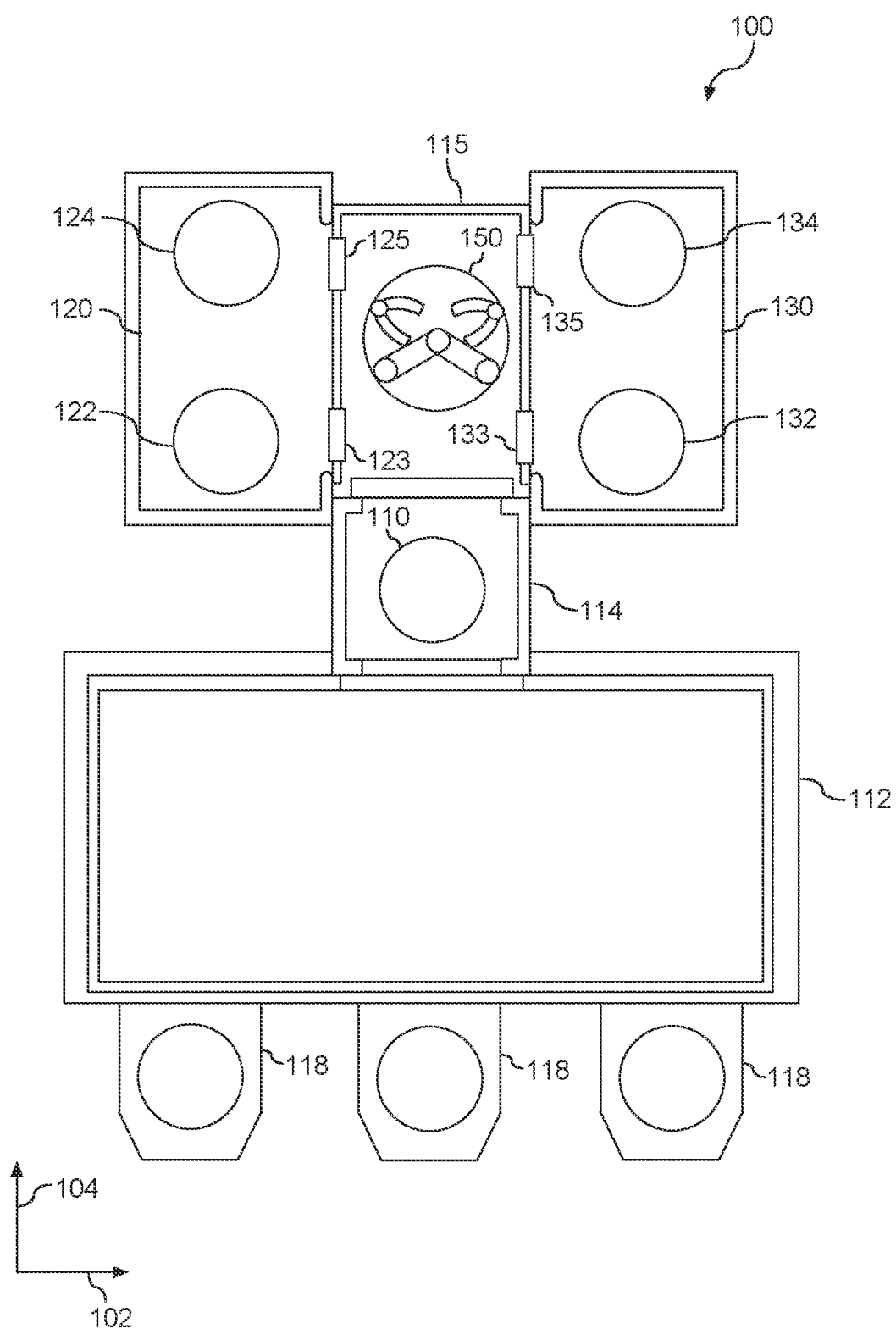
FIG. 1 depicts a plan view of an example processing system according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to systems for processing workpieces, such as semiconductor workpieces, opto-electronic workpieces, flat panel displays, or other suitable workpieces. The workpiece materials can include, for instance, silicon, silicon germanium, glass, plastic, or other suitable material. In some embodiments, the workpieces can be semiconductor wafers. The system can be used to implement a variety of workpiece manufacturing processes, including, but not limited to vacuum anneal processes, surface treatment processes, dry strip processes, dry etch processes, deposition processes, and other processes.

More particularly, the system can include a plurality of process chambers for processing the workpiece. Each process chamber can include one or more processing stations configured to receive and/or support a workpiece, such as a plurality of processing stations (e.g., two processing stations in a twin architecture) using a common process pressure (e.g., vacuum) environment. In some embodiments, one or more of the process chambers can be plasma process chambers having plasma based process sources, such as inductively coupled plasma sources, microwave sources, surface wave plasma sources, ECR plasma sources, capacitively coupled (e.g., parallel plate) plasma sources, etc.

In example embodiments, the processing system can include a loadlock chamber. The loadlock chamber can be configured to subject the workpieces to processing pressure (e.g., vacuum pressure) prior to transferring the workpieces to a process chamber. The loadlock chamber can include a workpiece column having a plurality of shelves to hold workpieces in a stacked arrangement. The system can further include a transfer chamber for transferring workpieces from the loadlock chamber to a process chamber and/or for transferring workpieces among different process chambers. In some embodiments, the transfer chamber can be maintained at a vacuum pressure or other suitable process pressure. The transfer chamber can be disposed in process flow communication between the loadlock chamber and at least one process chamber.

The transfer chamber can include a workpiece handling robot. A workpiece handling robot can include a robot primarily configured to transfer workpieces by rotating about an axis at a fixed point or area. The workpiece handling robot can be configured to transfer a plurality of workpieces (e.g., two workpieces) from the workpiece column in the loadlock chamber to two or more processing stations in the process chamber. Each processing station can include a workpiece support for supporting the workpiece during processing. In some embodiments, the workpiece handling robot can transfer the plurality of workpieces, for instance, using a scissor motion that simultaneously delivers workpieces to the two or more processing stations in the process chamber. As used herein, a scissor motion refers to the movement of two or more robot arms similar to the opening or closing of scissors. For instance, in one example scissor motion, first ends of the robot arms separate faster from one another than opposing second ends of the robot arms. In another example scissor motion, first ends of the robot arms separate from one another while the second ends or other portions of the robot arms remained in a fixed position.

In one example implementation, the workpiece handling robot can include a plurality of robot arms configured to rotate about a fixed pivot point. Each robot arm can be associated with one or more workpiece blades. Each workpiece blade can have an endeffector configured to support a workpiece. The workpiece handling robot can be configured to control the plurality of robot arms to transfer workpieces from the workpiece column to the at least two processing stations in a process chamber using a scissor motion where the plurality of robot arms separate from one another to transfer the workpiece blades to the processing stations.

In another example implementation, the workpiece handling robot can include a single primary arm that rotates about a pivot point or pivot area. The single primary arm can be coupled to a plurality of secondary arms. The secondary arms can each be coupled to at least one workpiece blade. Each workpiece blade can include an endeffector for supporting a workpiece. In some embodiments, the workpiece handling robot can be configured to transfer at least two workpieces from the workpiece column in the loadlock chamber to two processing stations in the process chamber using a scissor motion. During the scissor motion, the secondary arms can separate in a scissor like fashion so that the workpiece blade associated with one of the secondary arms transfers a workpiece to a first processing station and so that the workpiece blade associated with another of the secondary arms transfers a workpiece to the second processing station.

In some embodiments, the single primary arm and scissor motion of the secondary arms can be operated using a single motor. In some embodiments, the workpiece handling robot can have a second primary arm coupled to a plurality of secondary arms. The second primary arm can be operated in a manner similar to the other primary arm for purposes of, for instance, workpiece swap. In some embodiments, the primary arms may not be operated at the same time so that operation of both primary arms can be controlled using a single motor.

In some embodiments, the processing system can include a plurality of process chambers. Each process chamber can include at least one processing station, such as two or more processing stations. The workpiece handling robot in the transfer chamber can transfer workpieces among the plurality of process chambers and the loadlock chamber.

In example embodiments, at least two of the plurality of process chambers can be aligned on a straight side. For instance, a transfer chamber can include a straight side. The straight side may be shared by the at least two process chambers. For instance, in some embodiments, the straight side can be or can include a front wall of each of the at least two process chambers. For instance, a front wall of a process chambers can include an opening or other mechanism for receiving a workpiece, such as a slit door.

The at least two process chambers aligned on a straight side can be disposed in a linear arrangement. As one example, if a loadlock chamber defines a first direction along its longest side, then the at least two process chambers can be disposed such that the process chambers are aligned along a second direction that is perpendicular to the first direction. For instance, in some embodiments, a loadlock chamber can be disposed on a side of the transfer chamber that is perpendicular to the straight side. As another example, a first process chamber of the at least two process chambers can be spaced farther from a side of the transfer chamber having an entrance than a second process chamber of the at least two process chambers and in a same direction as the second process chamber. For example, the first process chamber and the second process chamber can be aligned along a continuous side of the transfer chamber and the process chambers.

Additionally and/or alternatively, in some implementations, the processing system can include two process chambers, including a first process chamber and a second process chamber, that are disposed on opposite sides of the transfer chamber. For example, the first process chamber may be aligned on a straight side with an additional process chamber, and the second process chamber may be disposed on an opposite side that is opposite the straight side. In some embodiments, the opposite side may additionally be a straight side.

The workpiece handling robot can be configured to transfer a plurality of workpieces from the workpiece column in the loadlock chamber to the one or more processing stations of the first process chamber and/or the one or more processing stations of the second process chamber (e.g., using a scissor motion). In addition, the workpiece handling robot can be configured to transfer a plurality of workpieces from the one or more processing stations of the first process chamber to the one or more processing stations of the second process chamber.

In another implementation, the processing system can include four process chambers, including a first process chamber, a second process chamber, a third process chamber, and a fourth process chamber. The first process chamber and the second process chamber can be disposed on opposite sides of the transfer chamber. The third process chamber can be disposed in a linear arrangement with the first process chamber. The fourth process chamber can be disposed in a linear arrangement with a second process chamber such that the third process chamber and the fourth process chamber are disposed on opposite sides of the transfer chamber.

Furthermore, in some implementations, the system can include two workpiece handling robots in the transfer chamber, including a first workpiece handling robot and a second workpiece handling robot. The system can further include a transfer position between the first workpiece handling robot and the second workpiece handling robot. The transfer position can allow the first workpiece handling robot (e.g., the workpiece handling robot with access to the loadlock chamber) to transfer workpieces to the second workpiece handling robot. The transfer position can include a workpiece column configured to support a plurality of workpieces in a stacked arrangement (e.g., on a plurality of shelves).

The first workpiece handling robot can be configured to transfer a plurality of workpieces from the workpiece column in the loadlock chamber to two or more processing stations of the first process chamber and/or the two or more processing stations of the second process chamber and/or to the workpiece column in the transfer position. In addition, the first workpiece handling robot can be configured to transfer a plurality of workpieces among the two or more processing stations of the first process chamber, the two or more processing stations of the second process chamber, and the workpiece column of the transfer position.

The second workpiece handling robot can be configured to transfer a plurality of workpieces from the workpiece column in the transfer chamber to the two or more processing stations of the third process chamber and/or the two or more processing stations of the fourth process chamber. In addition, the second workpiece handling robot can be configured to transfer a plurality of workpieces among the two or more processing stations of the third process chamber, the two or more processing stations of the fourth process chamber, and the workpiece column of the transfer position.

As another example, in some embodiments, the system can include a workpiece handling robot that is movable along at least one direction relative to the loadlock chamber and/or the plurality of process chambers. For instance, in some embodiments, a workpiece handling robot can be movable in a direction defined by the straight side, such as from a front of a transfer chamber to a back of the transfer chamber. For instance, in embodiments having at least two process chambers aligned on a straight side, the workpiece handling robot can be movable to at least a first position for transferring workpieces to and/or from a first process chamber of the at least two process chambers and a second position for transferring workpieces to and/or from a second process chamber of the at least two process chambers.

The processing system can be further extended to include more process chambers by adding transfer positions, workpiece handling robots and/or process chambers in linear fashion to provide any number of process chambers for performing workpiece treatments. In this way, multiple process modules can be integrated on the proposed system without vacuum or process pressure breaks, enabling multiple process integration schemes including combinations of dry etch and dry strip processes, surface pre-clean/treatment followed by film deposition processes, and consecutive film deposition processes, etc. Furthermore, in the proposed system architecture, workpieces can be swapped back and forth between two types of process chambers configured at opposite sides of each rotary vacuum robot, enabling a unique cyclic process capability (e.g., such as atomic layer etch processes).

According to example aspects of the present disclosure, each of the one or more process chambers can include a slit door. The slit door can be configured to provide for transfer of a workpiece between a workpiece handling robot and a process chamber, such as a processing station. For instance, in some embodiments, a process chamber can include one or more slit doors respective to (e.g., aligned with) one or more processing stations. For example, a process chamber having two processing stations can have two slit doors, one of which is aligned with each processing station. In some embodiments, a center of the slit door can be aligned with a center of the processing station in a direction. The direction can be respective to geometry of the process chamber. For instance, the direction can be along a depth of the process chamber. Additionally and/or alternatively, the direction can be respective to geometry of the workpiece handling robot. As one example, the centers of the slit doors can be slightly offset from the centers of the processing stations (e.g., slightly closer together) to facilitate linear extension from a center of the workpiece handling robot to each processing station simultaneously (e.g., by each arm). In some embodiments, the slit doors may be sealable to isolate process conditions of the process chamber from conditions external to the process chamber (e.g., conditions in a transfer chamber). For instance, in some embodiments, the slit doors may be or may include an aperture (e.g., a slit aperture) that can be sealed by a door or other seal. In some embodiments, such as embodiments where conditions of a process chamber and conditions external to the process chamber (e.g., proximate the slit door) are identical or suitably identical, the slit door may be or may include a nonsealable aperture.

According to example aspects of the present disclosure, slit doors on a plurality of process chambers that are aligned along a straight edge can be aligned along the straight edge. For instance, each of the slit doors can be disposed on a front side of a process chamber. The front sides and/or the slit doors may be aligned such that the front sides and/or the slit doors are flush with each other. For instance, a single plane may contain a lateral center of each of the slit doors on a single side of the processing system.

Additionally and/or alternatively, the slit doors can be aligned at a common point along a height of the process chambers. For instance, in some embodiments, a vertical offset between a slit door and a top surface and/or a bottom surface of the processing system can be about equivalent for each of the slit doors. As another example, a vertical offset between vertical centers of each of the slit doors can be about zero (e.g., less than about 5 centimeters).

The processing system according to example embodiments of the present disclosure can provide for a high productivity system with a small footprint. The footprint can be smaller relative to footprints associated with cluster-style tools. In addition, the processing system can process multiple workpieces (e.g., 4 workpieces, 8 workpieces, or more) with a significant improvement in processing system efficiency metrics, such as footprint/throughput, cost/throughput, and other metrics.

One example embodiment of the present disclosure is directed to a processing system for processing a plurality of workpieces. The processing system includes a loadlock chamber. The loadlock chamber can include workpiece column configured to support a plurality of workpieces in a stacked arrangement. The processing system includes at least two process chambers. The process chambers can be aligned along a straight side. The process chambers can include one or more slit doors. The at least two process chambers have at least one processing station(s). Each processing station can be associated with a workpiece support for supporting a workpiece during processing in the process chamber. The processing system includes a transfer chamber in process flow communication with the loadlock chamber and the at least two process chambers. The transfer chamber includes at least one workpiece handling robot. The workpiece handling robot has at least one arm configured to rotate about an axis. The workpiece handling robot is configured to transfer a plurality of workpieces from the workpiece column in the loadlock chamber to the at least two processing stations in the at least two process chambers (e.g., using a scissor motion).

In some embodiments, the at least two process chambers include a first process chamber and a second process chamber, each of the first process chamber and the second process chamber comprising at least two process stations. The first process chamber and the second process chamber are disposed on opposing sides of the transfer chamber such that the workpiece handling robot can transfer the plurality of workpieces among the first process chamber and the second process chamber.

In some embodiments, the first process chamber and the second process chamber are disposed in a linear arrangement. The system includes a transfer position configured to support a plurality of workpieces in a stacked arrangement. The workpiece handling robot can be configured to transfer a plurality of workpieces from the at least two processing stations in the first process chamber to the stacked arrangement in the transfer position. A second workpiece handling robot can be configured to transfer a plurality of workpieces from the stacked arrangement in the transfer position to the at least two processing stations in the second process chamber. The transfer position can be located in the transfer chamber In some embodiments, the at least two process chambers include a first process chamber and a second process chamber disposed on opposing sides of the transfer chamber. The at least two process chambers further include a third process chamber disposed in a linear arrangement with the first process chamber and a fourth process chamber disposed in a linear arrangement with the second process chamber such that the third process chamber and the fourth process chamber are disposed on opposing sides of the transfer chamber. Each of the first process chamber, second process chamber, third process chamber, and fourth process chamber can include at least two process stations.

In some embodiments, the system further includes a transfer position configured to support a plurality of workpieces in a stacked arrangement. The at least one workpiece handling robot includes a first workpiece handling robot configured to transfer a plurality of workpieces from the stacked arrangement in the loadlock chamber to the at least two processing stations in the first process chamber and a second workpiece handling robot configured to transfer a plurality of workpieces from the stacked arrangement in the transfer position to the at least two processing stations in the third process chamber.

In some embodiments, the workpiece handling robot has at least one primary arm configured to rotate about a pivot point. The primary arm can be coupled to a plurality of secondary arms. Each secondary arm can be associated with at least one workpiece blade configured to support one of the plurality of workpieces.

In some embodiments, the workpiece handling robot can be configured to extend the arm and to scissor open the plurality of workpiece blades to transfer the plurality of workpieces to the at least two processing stations in the process chamber. In some embodiments, the workpiece handling robot can be configured to extend the arm and to scissor open the plurality of workpiece blades using a single motor.

In some embodiments, the workpiece handling robot includes a first arm having one or more workpiece blades and a second arm comprising one or more workpiece blades. The first arm can be configured to transfer one of the plurality of workpieces from the column in the loadlock chamber to a first processing station in the process chamber and the second arm can be configured to transfer one of the plurality of workpieces from the column in the loadlock chamber to a second processing station in the process chamber.

Another example aspect of the present disclosure is directed to a method for processing a workpiece in a semiconductor processing system. The method includes transferring a plurality of workpieces to a workpiece column in a loadlock chamber. The workpiece column configured to support a plurality of workpieces in a stacked arrangement. The method includes transferring, with a workpiece handling robot located in a transfer chamber, the plurality of workpieces from the workpiece column to at least two processing stations in a first process chamber (e.g., using a scissor motion). The method includes performing a first treatment process on the plurality of workpieces in the first process chamber. The method includes transferring, with the workpiece handling robot, the plurality of workpieces to at least two processing stations in a second process chamber. The method includes performing a second treatment process on the plurality of workpieces in the second process chamber. In some embodiments, the second treatment process is different from the first treatment process.

In some embodiments, the method can include transferring, with the workpiece handling robot, the plurality of workpieces to a transfer position. The method can include transferring, with a second workpiece handling robot disposed in the transfer chamber, the plurality of workpieces from the transfer position to at least two processing stations in a third process chamber. The third process chamber can be disposed in linear arrangement with the first process chamber. The method can include performing a third treatment process on the plurality of workpieces in the third process chamber. The method can include transferring, with the second workpiece handling robot, the plurality of workpieces to at least two processing stations in a fourth process chamber. The fourth process chamber can be disposed in linear arrangement with the second process chamber. The method can include performing a fourth treatment process on the plurality of workpieces in the fourth process chamber.

Yet another example aspect of the present disclosure is directed to a processing system for processing workpieces. The system includes a workpiece column. The system includes a first workpiece handling robot. The system includes a second workpiece handling robot. The system includes a first process chamber. The system includes a second process chamber. The second process chamber disposed in linear arrangement with the first process chamber. The system includes a transfer station. The system includes a first workpiece handling robot configured to transfer a workpiece from the workpiece column to the at least two processing stations in the first process chamber. The first workpiece handling robot can be configured to transfer the workpiece from the first process chamber to the transfer position. The system includes a second workpiece handling robot configured to transfer the workpiece from the transfer position to the second process chamber.

Yet another example aspect of the present disclosure is directed to a processing system for processing a plurality of workpieces. The system includes a front end portion. The system includes a loadlock in process flow communication with the front end portion. The system includes a transfer chamber in process flow communication with the loadlock. The transfer chamber includes a first straight side, a second straight side and a third straight side, wherein the second straight side is connected to the loadlock, and the third straight side is an opposite side of the first straight side. The transfer chamber further includes at least two workpiece handling robots and a wafer transfer position between the two workpiece handling robots, wherein the transfer position includes at least one workpiece column. The system includes a first process chamber and a second process chamber in process flow communication with the transfer chamber, wherein the first process chamber and the second process chamber are connected to the first straight side of the transfer chamber, the first process chamber including at least one processing station, and the second process chamber including at least two processing stations. The system includes a third process chamber and a fourth process chamber in process flow communication with the transfer chamber, wherein the third process chamber and the fourth process chamber are connected to the third straight side of the transfer chamber, the third process chamber including at least one processing station, and the fourth process chamber including at least two processing stations.

Yet another example aspect of the present disclosure is directed to a method for processing a workpiece in a semiconductor processing system. The method includes transferring, with a first workpiece handling robot located in a front end portion, a plurality of workpieces to a workpiece column in a loadlock chamber, the workpiece column configured to support a plurality of workpieces in a stacked arrangement. The method includes transferring, with a second workpiece handling robot located in a transfer chamber, two workpieces from the workpiece column to at least two processing stations in a first process chamber through one or more first slit doors. The method includes performing a first treatment process on the two workpieces in the first process chamber. The method includes transferring, with the workpiece handling robot in the transfer chamber, one of the two workpieces to one second station in a second process chamber through one or more second slit doors and the other one of the two workpieces to one third station in a third process chamber through one or more third slit doors. The method includes performing a second treatment process on the two workpieces in the second process chamber and the third process chamber, wherein the second treatment process is different from the first treatment process.

Variations and modifications can be made to these example embodiments of the present disclosure. As used in the specification, the singular forms "a," "and," and "the" include plural referents unless the context clearly dictates otherwise. The use of "first," "second," "third," and "fourth" are used as identifiers and are directed to an order of processing. Example aspects may be discussed with reference to a "substrate," "wafer," or "workpiece" for purposes of illustration and discussion. Those of ordinary skill in the art, using the disclosures provided herein, will understand that example aspects of the present disclosure can be used with any suitable workpiece. The use of the term "about" in conjunction with a numerical value refers to within 20% of the stated numerical value.

With reference now to the FIGS., example embodiments of the present disclosure will now be discussed in detail. FIG. 1 depicts a processing system 100 according to example embodiments of the present disclosure. The processing system 100 can include a front end portion 112, a loadlock chamber 114, a transfer chamber 115 and a plurality of process chambers, including a first process chamber 120 and a second process chamber 130. As illustrated, the processing system 100 can define a width 102 and a length 104. For instance, the width 102 of the processing system 100 can correspond to depths of process chambers 120 and 130.

The front end portion 112 can be configured to be maintained at atmospheric pressure and can be configured to engage workpiece input devices 118. The workpiece input devices 118 can include, for instance, cassettes, front opening unified pods, or other devices for supporting a plurality of workpieces. Workpiece input devices 118 can be used to provide preprocess workpieces to the processing system 100 or to receive post-process workpieces from the processing system 100.

The front end portion 112 can include one or more robots (not illustrated) for transferring workpieces from workpiece input devices 118 to, for instance, the loadlock chamber 114, such as to and from a workpiece column 110 located in the loadlock chamber 114. In one example, the robot in the front end portion 112 can transfer preprocess workpieces to the loadlock chamber 114 and can transfer post-process workpieces from the loadlock chamber 114 to one or more of the workpiece input devices 118. Any suitable robot for transferring workpieces can be used in the front end portion 112 without deviating from the scope of the present disclosure. Workpieces can be transferred to and or from the loadlock chamber 114 through a suitable slit, opening, or aperture.

The loadlock chamber 114 can include a workpiece column 110 configured to support a plurality of workpieces in a stacked arrangement. The workpiece column 110 can include, for instance, a plurality of shelves. Each shelf can be configured to support one or more workpieces. In one example implementation, the workpiece column 110 can include one or more shelves for supporting preprocess workpieces and one or more shelves for supporting post-process workpieces.

The process chamber 120 can include slit doors 123 and 125. For instance, slit door 123 can be aligned with processing station 122. Similarly, slit door 125 can be aligned with processing station 124. As illustrated in FIG. 1, slit door 123 can be laterally aligned with slit door 125. For instance, slit door 123 and slit door 125 can each be aligned along a plane defined by a front wall of process chamber 120 and/or transfer chamber 115.

Furthermore, process chamber 130 can include slit doors 133 and 135. For instance, slit door 133 can be aligned with processing station 132. Similarly, slit door 135 can be aligned with processing station 134. As illustrated in FIG. 1, slit door 133 can be laterally aligned with slit door 135. For instance, slit door 133 and slit door 135 can each be aligned along a plane defined by a front wall of process chamber 130 and/or transfer chamber 115.

Figure 2:
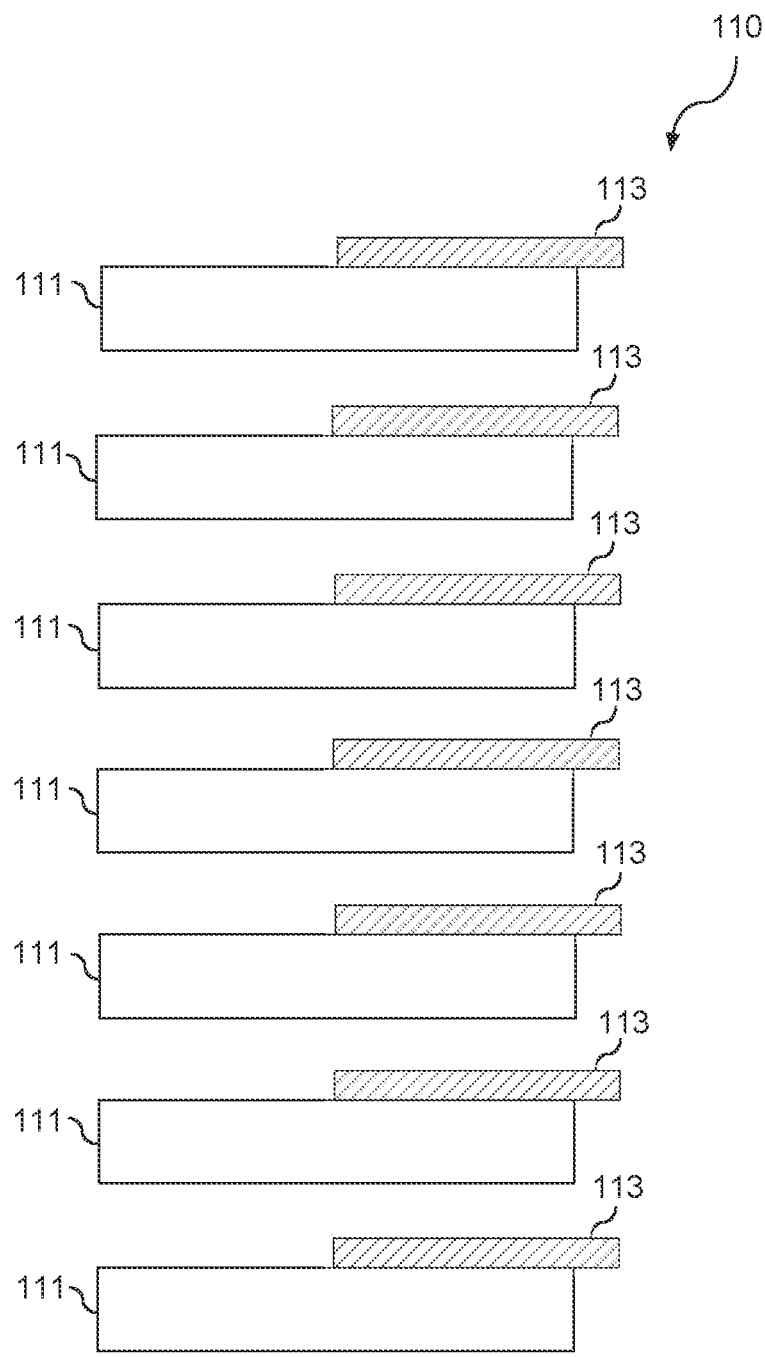
FIG. 2 depicts an example workpiece column according to example embodiments of the present disclosure.

FIG. 2 depicts a side view of an example workpiece column 110 according to example embodiments of the present disclosure. As shown, the workpiece column can include a plurality of shelves 111. Each shelf 111 can be configured to support a workpiece 113 so that a plurality of workpieces 113 can be arranged on the workpiece column 110 in a vertical/stacked arrangement.

Referring to FIG. 1, the loadlock chamber 114 can be used to adjust the pressure surrounding the workpieces from the pressure associated with the front end portion 112 to a process pressure, such as a vacuum or other process pressure, prior to transfer of the workpieces to process chambers, such as first process chamber 120 and/or second process chamber 130. In some embodiments, appropriate valves can be provided in conjunction with the loadlock chamber 114 and other chambers to appropriately adjust the process pressure for processing the workpieces. In some embodiments, the loadlock chamber 114 and the transfer chamber 115 can be maintained at the same pressure. In this embodiment, there is no need to seal the loadlock chamber 114 from the transfer chamber 115. Indeed, in some embodiments, the loadlock chamber 114 and the transfer chamber 115 can be a part of the same chamber.

The first process chamber 120 and the second process chamber 130 can be used to perform any of a variety of workpiece processing on the workpieces, such as vacuum anneal processes, surface treatment processes, dry strip processes, dry etch processes, deposition processes, and other processes. In some embodiments, one or more of the first process chamber 120 and the second process chamber 130 can include plasma based process sources such as, for example, inductively coupled plasma (ICP) sources, microwave sources, surface wave plasma sources, ECR plasma sources, and capacitively coupled (parallel plate) plasma sources.

As illustrated, each of the first process chamber 120 and second process chamber 130 includes a pair of processing stations in side-by-side arrangement so that a pair of workpieces can be simultaneously exposed to the same process. More particularly, the first process chamber 120 can include a first processing station 122 and a second processing station 124 in side-by-side arrangement. The second process chamber 130 can include a first processing station 132 and a second processing station 134 in side-by-side arrangement. Each processing station can include a workpiece support (e.g., a pedestal) for supporting a workpiece during processing. In some embodiments, each processing station can share a common pedestal with two portions for supporting a workpiece. The first process chamber 120 and/or the second process chamber 130 can be selectively sealed off from the transfer chamber 115 for processing.

According to particular aspects of the present disclosure, the transfer chamber 115 can include a workpiece handling robot 150. The workpiece handling robot 150 can be configured to transfer workpieces from the workpiece column 110 in the loadlock chamber 114 to the processing stations in the first process chamber 120 and/or the second process chamber 130. The workpiece handling robot 150 can also transfer workpieces between the first process chamber 120 and the second process chamber 130. For example, the workpiece handling robot 150 can simultaneously transfer the workpieces from the workpiece column in the loadlock chamber 114 to the two side-by-side processing stations 122 and 124 in the first process chamber 120 using, for instance, a scissor motion. Similarly, the workpiece handling robot 150 can simultaneously transfer workpieces from the workpiece column 110 in the loadlock chamber 114 to the two side-by-side processing stations 132 and 134 in the second process chamber 130 using, for instance, a scissor motion. Details concerning the operation of an example workpiece handling robot 150 will be discussed with reference to FIGS. 7A to 7D and FIGS. 8A and 8B.

The workpiece handling robot 150 can have a variety of configurations to support the transfer of workpieces according to example embodiments of the present disclosure. In one embodiment, the workpiece handling robot 150 can include a pair of arms configured to rotate about a pivot point. Each robot arm can be associated with a pair of workpiece blades. Each workpiece blade can have an endeffector configured to support a workpiece. The pair of workpiece blades associated with each arm can be used to accomplish workpiece swap at the processing stations of the process chambers. The pair of arms can be configured to transfer workpieces to the two processing stations of each process chamber using a scissor motion. In some embodiments, the slit doors 123, 125 and/or 133, 135 can be vertically aligned to facilitate transfer of the workpieces using the workpiece handling robot 150.

In another example implementation, the workpiece handling robot 150 can include at least one primary arm that rotates about a pivot point or pivot area. The primary arm can be coupled to a plurality of secondary arms. The secondary arms can each be coupled to at least one workpiece blade. Each workpiece blade can include an endeffector for supporting a workpiece. In some embodiments, the workpiece handling robot 150 can be configured to transfer at least two workpieces from the workpiece column 110 in the loadlock chamber 114 to, for instance, two side-by-side processing stations 122 and 124 in first process chamber 120 using a scissor motion. In some embodiments, the scissor motion can be implemented using a single motor.

Figure 3:
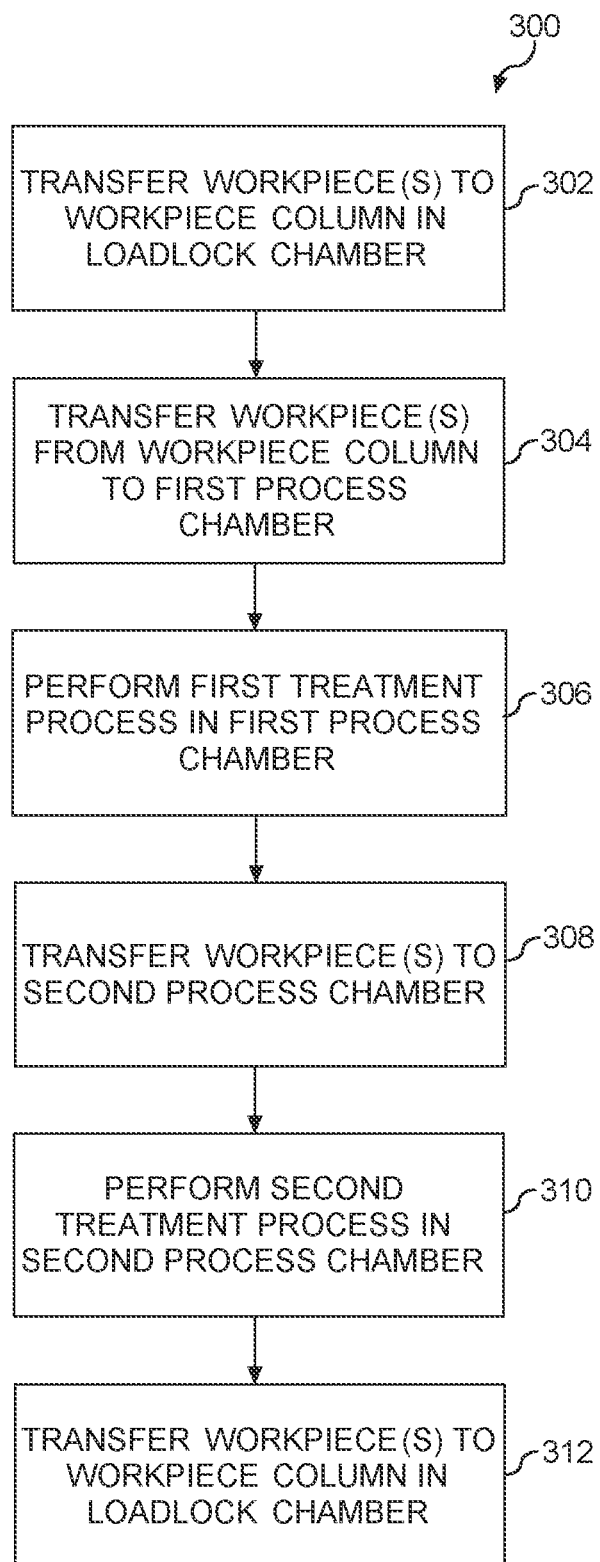
FIG. 3 depicts a flow diagram of an example processing method according to example embodiments of the present disclosure.

FIG. 3 depicts a flow diagram of an example method (300) for processing a workpiece in a processing system. The method (300) can be implemented using the processing system 100 of FIG. 1. FIG. 3 depicts steps performed in a particular order for purposes of illustration and discussion. Those of ordinary skill in the art, using the disclosures provided herein, will understand that various steps of any of the methods provided herein can be adapted, rearranged, performed simultaneously, omitted, and/or modified in various ways without deviating from the scope of the present disclosure.

At (302), the method includes transferring a plurality of workpieces to a workpiece column in a loadlock chamber. For instance, a plurality of workpieces can be transferred from a front end portion of process chamber 100 to a workpiece column 110 in a loadlock chamber 114. The workpieces can be transferred to the workpiece column 110, for instance, using one or more robots associated with the front end portion of the process chamber 100.

At (304), the method includes transferring, with a workpiece handling robot located in a transfer chamber, the plurality of workpieces from the workpiece column to at least two processing stations in a first process chamber. For instance, workpiece handling robot 150 can transfer two workpieces to processing station 122 and processing station 124 respectively in process chamber 120. In some embodiments, the workpiece handling robot 150 can transfer workpieces to processing station 122 and processing station 124 in process chamber 120 using a scissor motion. The workpiece handling robot 150 can transfer the plurality of workpieces to the at least two processing stations by passing the workpieces through at least one slit door. The at least one slit door can be aligned with the at least two processing stations. Additionally and/or alternatively, the at least one slit door can be vertically and/or laterally aligned with other slit doors in the processing system.

At (306), the method includes performing a first treatment process on the plurality of workpieces in the first process chamber. The first treatment process can include, for instance, an anneal process, a thermal treatment process, a surface treatment process, a dry strip process, a dry etch process, a deposition process or other process.

At (308), the method includes transferring, with the workpiece handling robot, the plurality of workpieces to at least two processing stations in a second process chamber. The second process chamber can be aligned with the first process chamber along a straight side For instance, workpiece handling robot 150 can transfer two workpieces to processing station 132 and processing station 134 respectively in process chamber 130. In some embodiments, the workpiece handling robot 150 can transfer workpieces to processing station 132 and processing station 134 in process chamber 130 using a scissor motion. The workpiece handling robot can transfer the workpieces through one or more second slit doors that are vertically aligned with the one or more first slit doors.

In some embodiments, the workpiece handling robot can transfer the plurality of workpieces to at least two processing stations in the second process chamber from the first process chamber. In some embodiments, the workpiece handling robot can transfer the plurality of workpieces to at least two processing stations in the second process chamber from, for instance, a transfer position as discussed in detail below (e.g., from a workpiece column in a transfer position).

At (310), the method includes performing a second treatment process on the plurality of workpieces in the second process chamber. The second treatment process can include, for instance, an anneal process, a thermal treatment process, a surface treatment process, a dry strip processes, a dry etch process, a deposition process or other process. In some embodiments, the second treatment process can be the same as or different from the first treatment process.

At (312), the method can include transferring the processed workpieces back to the workpiece column in the loadlock chamber. For instance, workpiece handling robot 150 can transfer two workpieces from the first process chamber 120 and/or the second process chamber 130. One or more robots located in a front end of the processing system can then transfer to processed workpieces to, for instance, a cassette.

According to particular aspects of the present disclosure, additional process chambers can be added to the processing system in linear fashion to provide the capability to process additional workpieces. For instance, FIG. 4 depicts an example processing system 200 with four process chambers according to example embodiments of the present disclosure.

Figure 4:
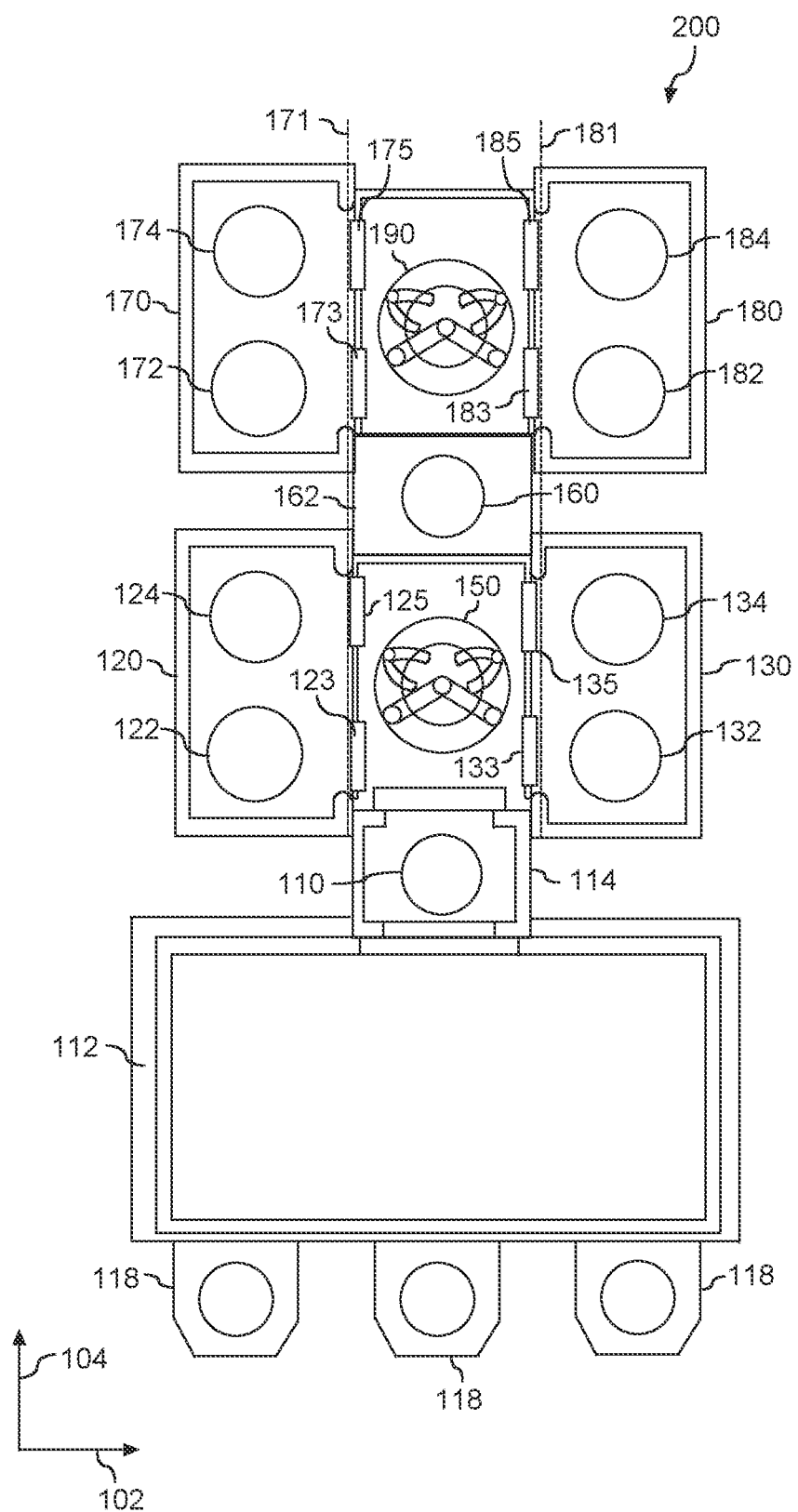
FIG. 4 depicts a plan view of an example processing system according to example embodiments of the present disclosure.

Similar to the processing system of FIG. 1, the processing system 200 of FIG. 4 can include a front end portion 112, a loadlock chamber 114, a transfer chamber 115 and a plurality of process chambers, including a first process chamber 120 and a second process chamber 130. The system can include a first workpiece handling robot 150 for transferring workpieces to and from the workpiece column 110 in the loadlock chamber and the first process chamber 120 and second process chamber 130 and/or between the first process chamber 120 and the second process chamber 130.

Additionally, the processing system 200 can include additional process chambers, including a third process chamber 170 and fourth process chamber 180. The third process chamber 170 is disposed in linear arrangement with the first process chamber 120 and the fourth process chamber 180 is disposed in linear arrangement with the second process chamber 130 such that the third process chamber 170 and the fourth process chamber 180 are disposed on opposing sides of the transfer chamber 115. For instance, as illustrated in FIG. 4, third process chamber 170 can be aligned with first process chamber 120 along straight side 171. The straight side 171 may or may not be continuous. For instance, in some embodiments, transfer position 162 may be disposed between the process chamber 120 and the process chamber 170 which interrupts straight side 171. However, the portion of straight side 171 proximate and/or including process chamber 170 may be flush with the portion of straight side 171 proximate and/or including process chamber 120. Additionally and/or alternatively, fourth process chamber 180 can be aligned with second process chamber 130 along straight side 181. The straight side 181 may or may not be continuous. For instance, in some embodiments, transfer position 162 may be disposed between the process chamber 130 and the process chamber 180 which interrupts straight side 181. However, the portion of straight side 181 proximate and/or including process chamber 180 may be flush with the portion of straight side 181 proximate and/or including process chamber 130.

The third process chamber 170 and the fourth process chamber 180 can be used to perform any of a variety of workpiece processing on the workpieces, such as vacuum anneal processes, thermal treatment process, surface treatment processes, dry strip processes, dry etch processes, deposition processes, and other processes. In some embodiments, one or more of the third process chamber 170 and the fourth process chamber 180 can include plasma based process sources such as, for example, inductively coupled plasma (ICP) sources, microwave sources, surface wave plasma sources, ECR plasma sources, and capacitively coupled (parallel plate) plasma sources.

As illustrated, each of the third process chamber 170 and fourth process chamber 180 includes a pair of processing stations in side-by-side arrangement so that a pair of workpieces can be simultaneously exposed to the same process. More particularly, the third process chamber 170 can include a first processing station 172 and a second processing station 174 in side-by-side arrangement. The fourth process chamber 180 can include a first processing station 182 and a second processing station 184 in side-by-side arrangement. Each processing station can include a workpiece support (e.g., a pedestal) for supporting a workpiece during processing. In some embodiments, the third process chamber 170 and/or the fourth process chamber 180 can be selectively sealed off from the transfer chamber 115 for processing.

To transfer workpieces to the third process chamber 170 and second process chamber 180, the system 200 can further include a transfer position 162 and a second workpiece handling robot 190. The transfer position 162 can be a part of the transfer chamber 162 or can be a separate chamber. The transfer position 162 can include a workpiece column 160 for supporting a plurality of workpieces in a stacked arrangement. For instance, the workpiece column 160 can include a plurality of shelves configured to support workpieces in a stacked vertical arrangement. The first workpiece handling robot 150 can be configured to transfer workpieces from the workpiece column 110, the first process chamber 120, or the second process chamber 130 to the workpiece column 160 in the transfer position 162.

The processing system 200 of FIG. 4 can include slit doors 123, 125, 133, and 135 similar to the processing system 100 of FIG. 1. Furthermore, the process chamber 170 can include slit doors 173 and 175. For instance, slit door 173 can be aligned with processing station 172. Similarly, slit door 175 can be aligned with processing station 174. As illustrated in FIG. 1, slit door 173 can be laterally aligned with slit door 175. For instance, slit door 173 and slit door 175 can each be aligned along a plane defined by a front wall of process chamber 170 and/or transfer chamber 115. As illustrated in FIG. 4, the slit doors 173 and 175 of process chamber 170 can be aligned with the slit doors 123 and 125 of process chamber 120 along straight side 171. For instance, the slit doors 123, 125, 173, and/or 175 may be spaced apart in direction 104 and have an offset along direction 102 of about zero.

Furthermore, process chamber 180 can include slit doors 183 and 185. For instance, slit door 183 can be aligned with processing station 182. Similarly, slit door 185 can be aligned with processing station 184. As illustrated in FIG. 1, slit door 183 can be laterally aligned with slit door 185. For instance, slit door 183 and slit door 185 can each be aligned along a plane defined by a front wall of process chamber 180 and/or transfer chamber 115. As illustrated in FIG. 4, the slit doors 183 and 185 of process chamber 180 can be aligned with the slit doors 133 and 135 of process chamber 130 along straight side 181. For instance, the slit doors 133, 135, 183, and/or 185 may be spaced apart in direction 104 and have an offset along direction 102 of about zero.

Figure 5:
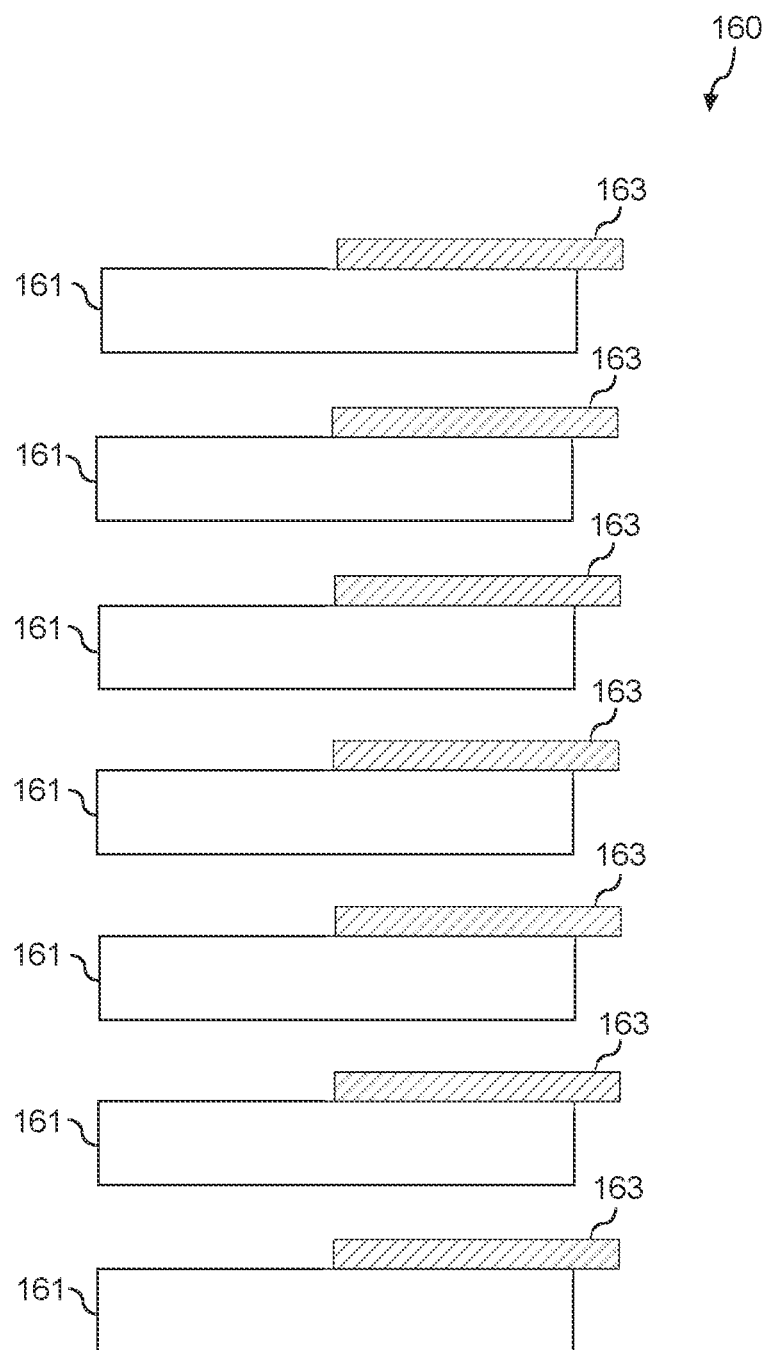
FIG. 5 depicts an example transfer position according to example embodiments of the present disclosure.

FIG. 5 depicts a side view of an example workpiece column 160 in a transfer position 162 according to example embodiments of the present disclosure. As shown, the workpiece column can include a plurality of shelves 161. Each shelf 161 can be configured to support a workpiece 163 so that a plurality of workpieces 163 can be arranged on the workpiece column 160 in a vertical/stacked arrangement.

A second workpiece handling robot 190 can be configured to transfer workpieces from the workpiece column 160 in the transfer position 162 to the processing stations in the third process chamber 170 and/or the fourth process chamber 180. The workpiece handling robot 190 can also transfer workpieces from the third process chamber 170 to the fourth process chamber 180. For example, the workpiece handling robot 190 can simultaneously transfer the workpieces from the workpiece column 160 in the transfer to the two side-by-side processing stations 172 and 174 in the third process chamber 170 using, for instance, a scissor motion. Similarly, the workpiece handling robot 190 can simultaneously transfer workpieces from the workpiece column 160 in the transfer position 162 to the two side-by-side processing stations 182 and 184 in the fourth process chamber 130 using, for instance, a scissor motion.

The workpiece handling robot 190 can have a variety of configurations to support the transfer of workpieces according to example embodiments of the present disclosure. In one embodiment, the workpiece handling robot 150 can include a pair of arms configured to rotate about a pivot point. Each robot arm can be associated with a pair of workpiece blades. Each workpiece blade can have an endeffector configured to support a workpiece. The pair of workpiece blades associated with each arm can be used to accomplish workpiece swap at the processing stations of the process chambers. The pair of arms can be configured to transfer workpieces to the two processing stations of each process chamber using a scissor motion.

In another example implementation, the workpiece handling robot 190 can include at least one primary arm that rotates about a pivot point or pivot area. The primary arm can be coupled to a plurality of secondary arms. The secondary arms can each be coupled to at least one workpiece blade. Each workpiece blade can include an endeffector for supporting a workpiece. In some embodiments, the workpiece handling robot 190 can be configured to transfer at least two workpieces from the workpiece column 160 in the transfer position 162 to, for instance, two side-by-side processing stations 172 and 174 in the third process chamber 170 using a scissor motion. In some embodiments, the scissor motion can be implemented using a single motor.

The processing system 200 includes four process chambers 120, 130, 170, and 180 and can be configured to simultaneously process up to eight workpieces at a time. Additional process stations can be added in linear fashion to provide additional processing capability. For instance, a fifth process chamber can be added in linear arrangement with the third process chamber 170. A sixth process chamber can be added in linear arrangement with the fourth process chamber 180. An additional transfer position and workpiece handling robot can be used to transfer workpieces to and from the fifth and sixth process chambers. Additional process chambers can be included by extending the processing system in linear fashion in this manner.

Figure 6A:
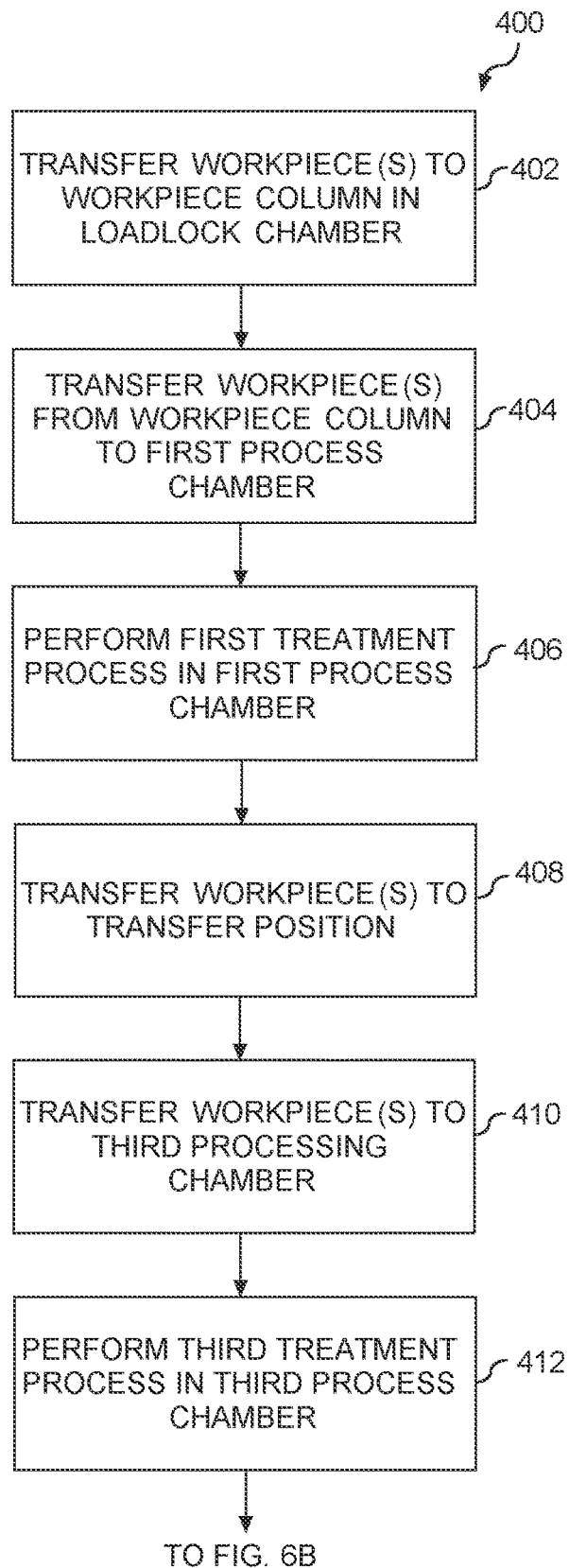
FIGS. 6A and 6B depict a flow diagram of an example processing method according to example embodiments of the present disclosure.
Figure 6B:
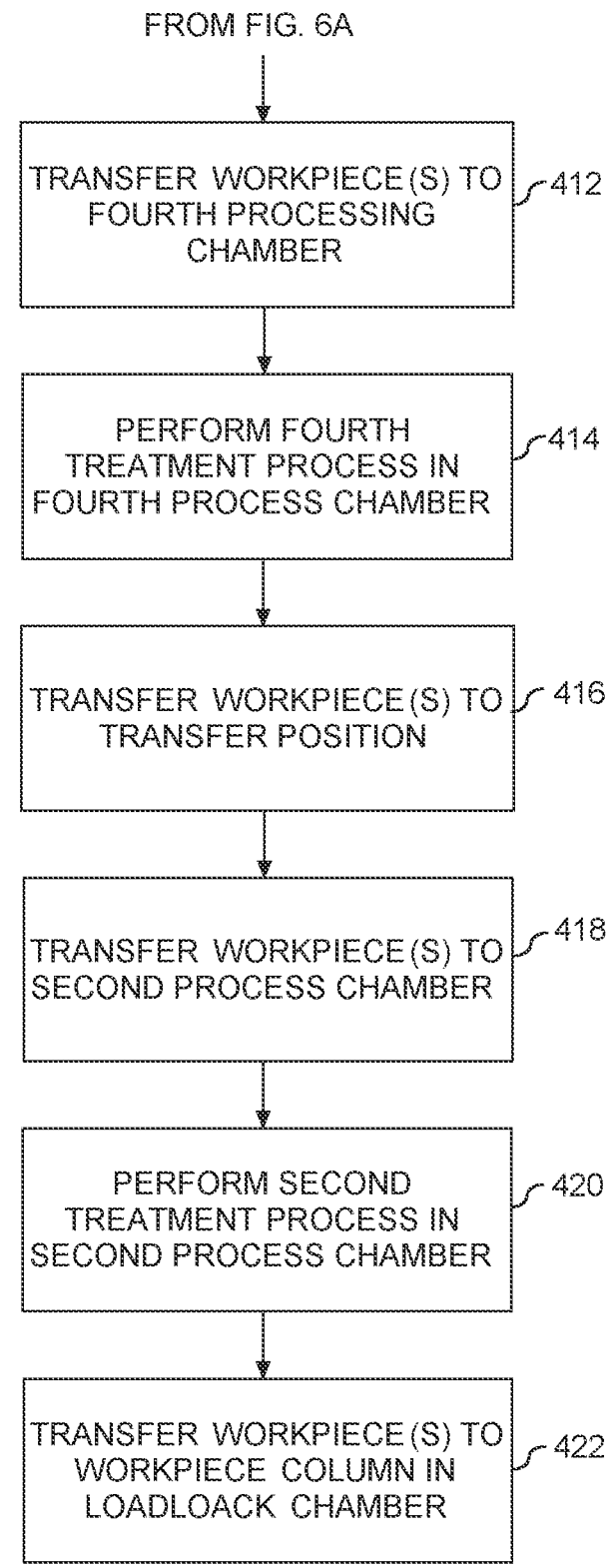

FIGS. 6A and 6B depict a flow diagram of an example method (400) for processing a workpiece in a processing system. The method (400) can be implemented using the processing system 200 of FIG. 4. FIGS. 6A and 6B depict steps performed in a particular order for purposes of illustration and discussion. Those of ordinary skill in the art, using the disclosures provided herein, will understand that various steps of any of the methods provided herein can be adapted, rearranged, performed simultaneously, omitted, and/or modified in various ways without deviating from the scope of the present disclosure.

At (402), the method includes transferring a plurality of workpieces to a workpiece column in a loadlock chamber. For instance, a plurality of workpieces can be transferred from a front end portion of process chamber 100 to a workpiece column 110 in a loadlock chamber 114. The workpieces can be transferred to the workpiece column 110, for instance, using one or more robots associated with the front end portion of the process chamber 100.

At (404), the method includes transferring, with a workpiece handling robot located in a transfer chamber, the plurality of workpieces from the workpiece column to at least two processing stations in a first process chamber. For instance, workpiece handling robot 150 can transfer two workpieces to processing station 122 and processing station 124 respectively in process chamber 120. In some embodiments, the workpiece handling robot 150 can transfer workpieces to processing station 122 and processing station 124 in process chamber 120 using a scissor motion.

At (406), the method includes performing a first treatment process on the plurality of workpieces in the first process chamber. The first treatment process can include, for instance, an anneal process, a thermal treatment process, a surface treatment process, a dry strip processes, a dry etch process, a deposition process or other process.

At (408), the method can include transferring, with the workpiece handling robot, the plurality of workpieces to a transfer position. Workpiece handling robot 150 can transfer two workpieces to processing station 122 and processing station 124 respectively in process chamber 120. In some embodiments, the workpiece handling robot 150 can transfer workpieces to a workpiece column 160 located at a transfer position 162.

At (410), the method can include transferring, with a second workpiece handling robot disposed in the transfer chamber, the plurality of workpieces from the transfer position to at least two processing stations in a third process chamber. The third process chamber can be disposed in linear arrangement with the first process chamber. For instance, workpiece handling robot 190 can transfer two workpieces from workpiece column 160 in the transfer position 162 to processing station 172 and processing station 174 respectively in process chamber 170. In some embodiments, the workpiece handling robot 190 can transfer workpieces to processing station 172 and processing station 174 in process chamber 170 using a scissor motion.

At (412) the method can include performing a third treatment process on the plurality of workpieces in the third process chamber. The third treatment process can include, for instance, an anneal process, a thermal treatment process, a surface treatment process, a dry strip processes, a dry etch process, a deposition process or other process.

At (414), the method can include transferring, with the second workpiece handling robot, the plurality of workpieces to at least two processing stations in a fourth process chamber. The fourth process chamber can be disposed in linear arrangement with the second process chamber. For instance, workpiece handling robot 190 can transfer two workpieces from workpiece column 160 in the transfer position 162 to processing station 182 and processing station 184 respectively in process chamber 180. For instance, the workpiece handling robot 190 can transfer workpieces to processing station 182 and processing station 184 in process chamber 180 using a scissor motion. In some embodiments, the workpiece handling robot 190 can transfer two workpieces from the process chamber 170 to processing station 182 and processing station 184 in process chamber 180. For instance, the workpiece handling robot 190 can transfer workpieces to processing station 182 and processing station 184 in process chamber 180 using a scissor motion At (416), the method can include performing a fourth treatment process on the plurality of workpieces in the fourth process chamber. The fourth treatment process can include, for instance, an anneal process, a thermal treatment process, a surface treatment process, a dry strip processes, a dry etch process, a deposition process or other process.

At (418), the method can include transferring, by the second workpiece handling robot, the plurality of workpieces back to the transfer position. For instance, workpiece handling robot 190 can transfer workpieces from the process chamber 170 and/or the process chamber 180 to a workpiece column 160 located at the transfer position 162.

At (422), the method includes transferring, with the workpiece handling robot, the plurality of workpieces to at least two processing stations in a second process chamber. For instance, workpiece handling robot 150 can transfer two workpieces to processing station 132 and processing station 134 respectively in process chamber 130. In some embodiments, the workpiece handling robot 150 can transfer workpieces to processing station 132 and processing station 134 in process chamber 130 using a scissor motion.

In some embodiments, the workpiece handling robot can transfer the plurality of workpieces to at least two processing stations in the second process chamber from the first process chamber 120. In some embodiments, the workpiece handling robot can transfer the plurality of workpieces to at least two processing stations in the second process chamber 120 from, for instance, a workpiece column 160 located at a transfer position 162.

At (424), the method includes performing a second treatment process on the plurality of workpieces in the second process chamber. The second treatment process can include, for instance, an anneal process, a thermal treatment process, a surface treatment process, a dry strip processes, a dry etch process, a deposition process or other process. In some embodiments, the second treatment process can be the same as or different from the first treatment process, the third treatment process, and/or the fourth treatment process.

At (426), the method can include transferring the processed workpieces back to the workpiece column in the loadlock chamber. For instance, workpiece handling robot 150 can transfer two workpieces from the first process chamber 120 and/or the second process chamber 130. One or more robots located in a front end of the processing system can then transfer to processed workpieces to, for instance, a cassette.

Referring to FIGS. 7A to 7D, the operation of an example a workpiece handling robot 150 according to an example embodiment will be set forth. The workpiece handling robot 150 of FIGS. 7A-7D includes two primary robot arms 152 and 154 configured to rotate about a fixed point. Each of the robot arms 152 and 154 can include at least one workpiece blade. For instance, robot arm 152 can include workpiece blade 156. Robot arm 154 can include workpiece blade 158. Each workpiece blade 156 and 158 can be configured to grab, hold, and release a workpiece using, for instance, a suitable endeffector. In some embodiments, each of the robot arms 152 and 154 can include a pair of workpiece blades. The additional workpiece blades can be used, for instance, for workpiece swap. Each of the robot arms 152 and 154 can be independently operated using, for instance, a motor.

Figure 7A:
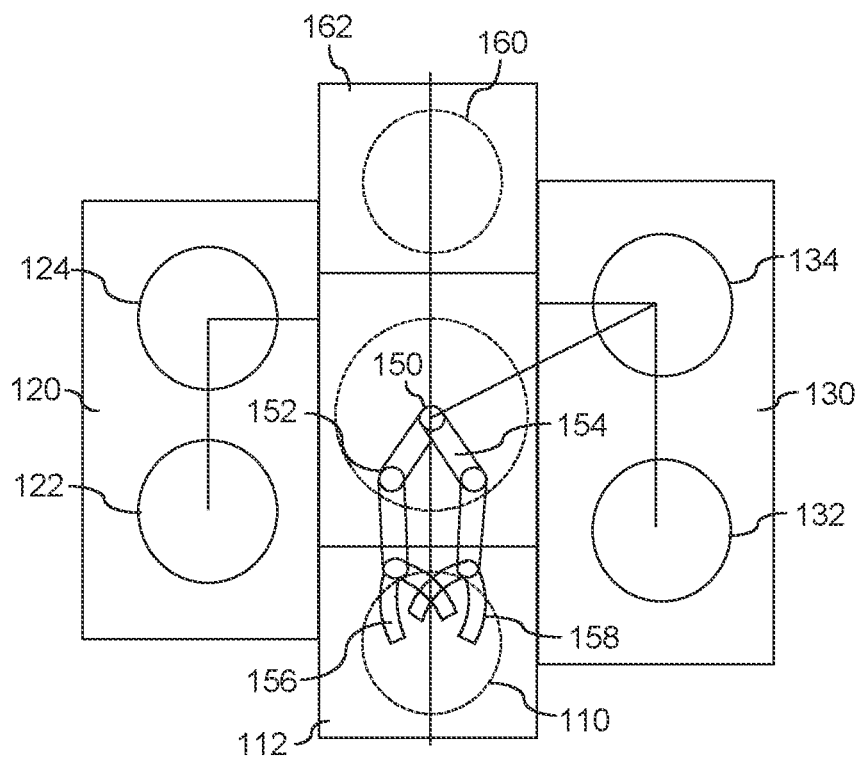
FIGS. 7A, 7B, 7C, and 7D depict the example transfer of workpieces in a processing system according to example embodiments of the present disclosure.
Figure 7B:
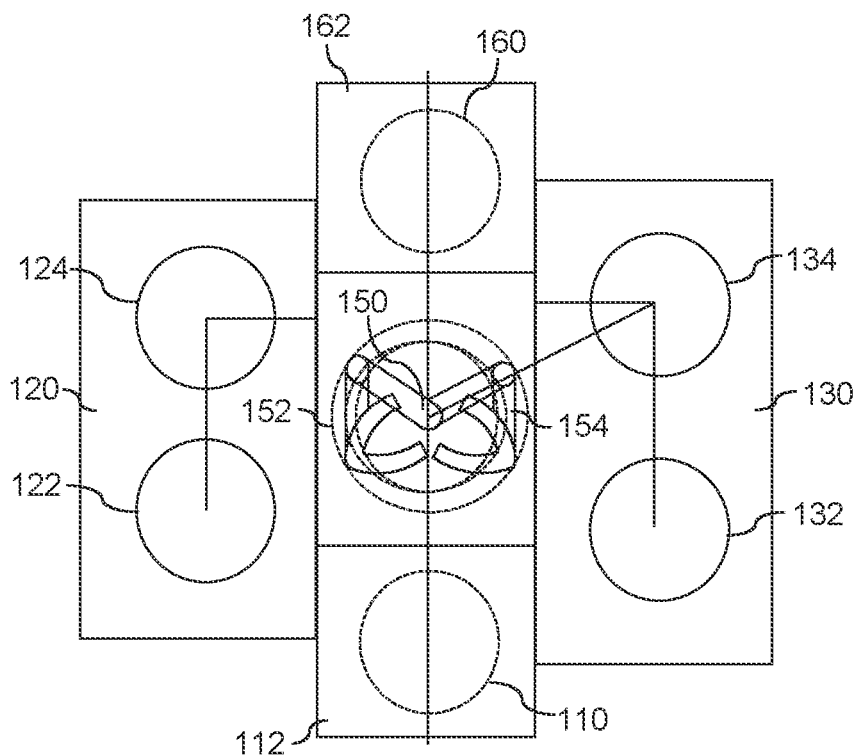

As shown in FIG. 7A, both robot arms 152 and 154 of the workpiece handling robot 150 can be extended to grab a workpiece from the workpiece column 110 in the loadlock chamber 114 using a workpiece blade. For instance, robot arm 152 can be extended to grab a workpiece from workpiece column 110 using workpiece blade 156. Robot arm 154 can be extended to grab a workpiece from workpiece column 110 using workpiece blade 158. As shown in FIG. 7B, the workpiece handling robot 150 can then be operated to retract the robot arms 152 and 154 to a retracted position.

Figure 7C:
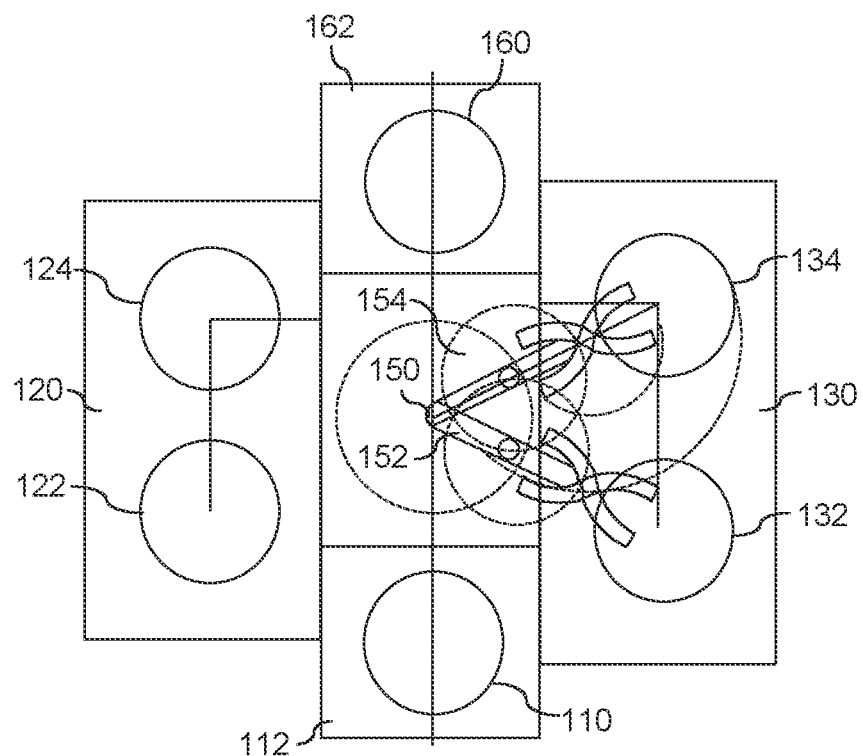
Figure 7D:
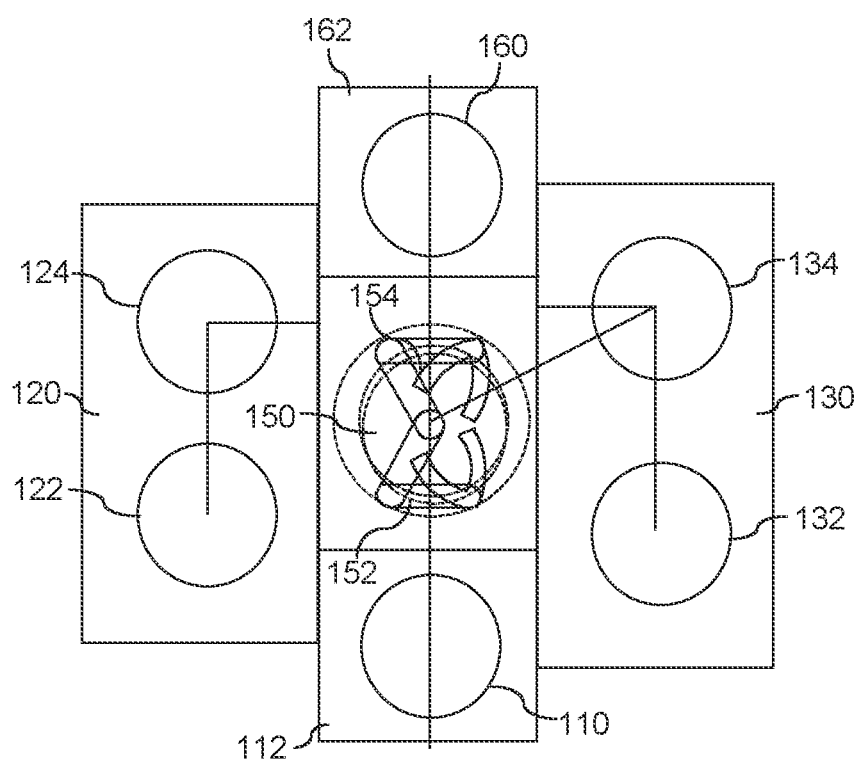

FIG. 7C shows the transfer of workpieces to side-by-side processing stations 132 and 134 in process chamber 130 according to example embodiments of the present disclosure. The first robot arm 152 can be rotated and extended so that a workpiece blade can transfer a workpiece to the first processing station 132. Prior to the actual transfer of the workpiece to the first processing station, a second workpiece blade associated with the first robot arm 152 can grab a workpiece already located on the first processing station 132. The second robot arm 154 can be rotated and extended so that a workpiece blade can be transfer to the second processing station 134. Prior to the actual transfer of the workpiece to the first processing station, a second workpiece blade associated with the second robot arm 154 can grab a workpiece already located on the second processing station 134. In particular embodiments, the first robot arm 152 and the second robot arm 154 can be operated in a scissor motion fashion such that the second robot arm 154 separates from the first robot arm 152. In some embodiments, the robot arms 152 and 154 can simultaneously transfer workpieces to the first processing station 132 and the second processing station 134 respectively.

Once the workpieces that were previously located at processing stations 132 and 134 have been grabbed and the new workpieces have been transferred to the processing stations 132 and 134, the workpiece handling robot 150 can be operated to retract robot arms 152 and 154 to a retracted position. The workpiece handling robot 150 can then be rotated and operated to deliver workpieces to other portions of the system, such as workpiece column 110 in the loadlock chamber 114, the workpiece column 160 in the transfer position 162, or the processing stations 122 and 124 in the process chamber 120.

Figure 8A:
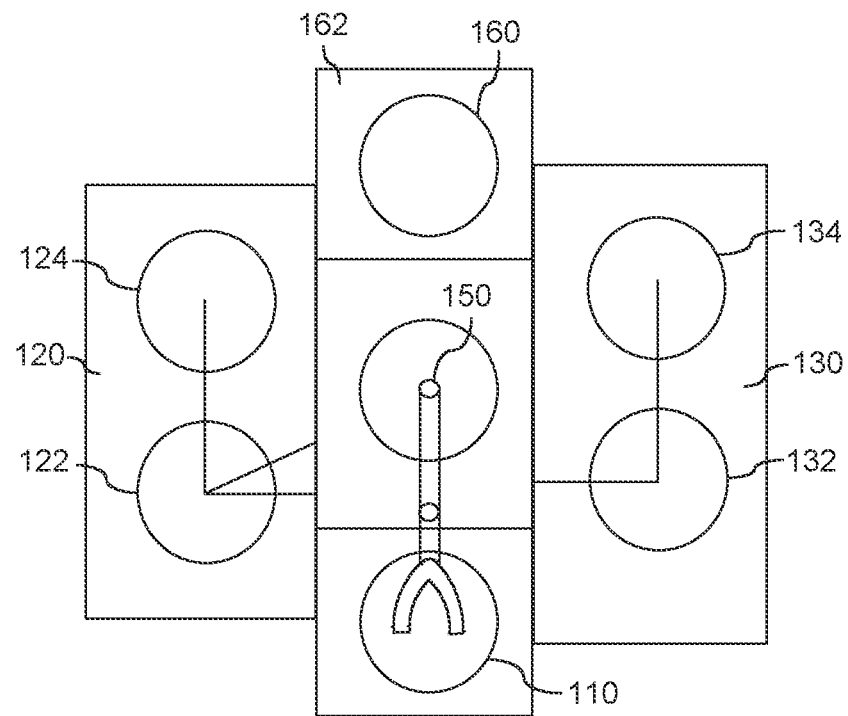
FIGS. 8A and 8B depict an example workpiece handling robot performing a transfer of a plurality of workpieces from a workpiece column to at least two processing stations in a process chamber using a scissor motion according to example embodiments of the present disclosure
Figure 8B:
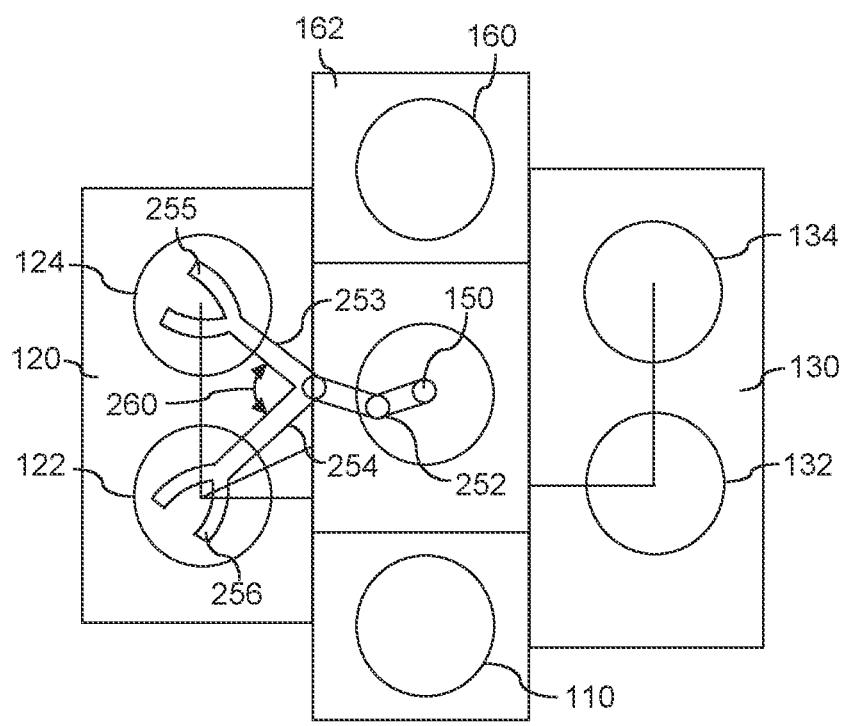

FIGS. 8A and 8B depict the operation of an example workpiece handling robot 150 according to another example embodiment of the present disclosure. The workpiece handling robot 150 of FIGS. 8A and 4B includes a single primary robot arm 252 and two secondary robot arms 253 and 254 attached to the primary arm 252 at a pivot point on the primary robot arm 252. Each of the secondary robot arms 253 and 254 can include at least one workpiece blade. For instance, secondary robot arm 253 can include workpiece blade 255. Secondary robot arm 254 can include workpiece blade 256. Each workpiece blade 255 and 256 can be configured to grab, hold, and release a workpiece using, for instance, a suitable endeffector. In some embodiments, each of the robot arms secondary 253 and 254 can each include a pair of workpiece blades. The additional workpiece blades can be used, for instance, for workpiece swap.

Referring to FIG. 8A, the workpiece handling robot 150 can be operated to extend the primary robot arm and the secondary robot arms to grab a workpiece from the workpiece column 110 using a workpiece blade. Each secondary arm can grab a workpiece using a suitable workpiece blade. The robot 150 can then retract the primary robot arm and secondary robot arms to a retracted position. The robot 150 can then rotate the primary robot arm and secondary robot arms to a position to deliver the workpieces to, for instance, the first process chamber 120.

As shown in FIG. 8B, the workpiece handling robot 150 can extend the primary robot arm 252. The secondary robot arms 253 and 254 can be caused to move in a scissor motion 260 (e.g., separate from one another) to simultaneously deliver the workpieces to the first processing station 122 and the second processing station 124 in the process chamber 120.

Various mechanisms can be used to operate the secondary arms 253 and 254 in a scissor motion. For instance, in one example, a mechanism (e.g., a dividing member) can be positioned to separate the secondary robot arms 253 and 254 in a scissor motion when the workpiece handling robot extends the primary arm 252. In this way, the extension of the primary robot arm 252 and the secondary robot arms 253 and 254 according to example embodiments can be operated using a single motor. In another example, the workpiece handling robot 150 can include one or more additional motors to independently operate the secondary robot arms 253 and 254 in a scissor motion, different from a motor to operate the primary robot arm 252, to deliver workpieces to the processing stations 122 and 124. In some other embodiments, a mechanism can be positioned to cause the scissor motion of the secondary robot arms 253 and 254 by the rotation angle of the workpiece handling robot 150 to occur. As shown in FIGS. 4A and 4B, the secondary arms 253 and 254 can be caused to move in a scissor motion 260 when the workpiece handling robot 150 rotates toward the process chamber 120, but not when the workpiece handling robot 150 rotates toward the workpiece column 110.

In another example implementation, the workpiece handling robot 150 can include a second primary arm (not illustrated). The second primary arm can have two secondary robot arms. Each of the secondary robot arms can include at least one workpiece blade. The secondary robot arms attached to the second primary robot arm can be caused to move in a scissor motion (e.g., separate from one another), and the workpiece blades can simultaneously grab the workpieces already located on the processing stations 122 and 124 in the process chamber 120, prior to the actual transfer of the new workpieces to process chamber 120 by the secondary robot arms 253 and 254 attached to the first primary robot arm 252. In another example, the two primary arms never extend at the same time and can be operated using a single motor.

Figure 9:
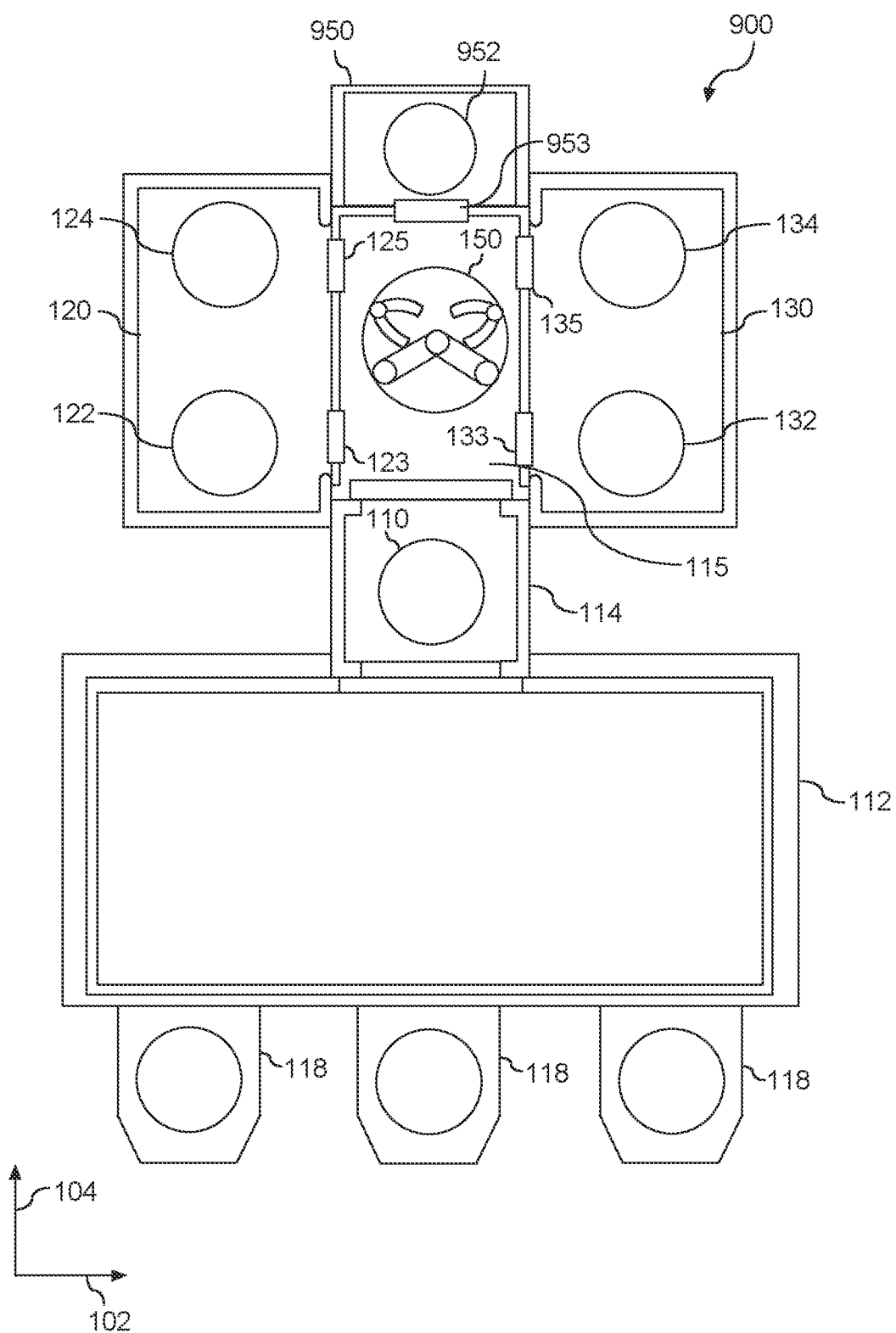
FIG. 9 depicts a plan view of an example processing system according to example embodiments of the present disclosure.

FIG. 9 depicts a plan view of an example processing system 900 according to example embodiments of the present disclosure. Similar to the processing system 100 of FIG. 1, the processing system 900 of FIG. 9 can include a front end portion 112, a loadlock chamber 114, a transfer chamber 115 and a plurality of process chambers, including a first process chamber 120 and a second process chamber 130. The system can include a first workpiece handling robot 150 for transferring workpieces to and from the workpiece column 110 in the loadlock chamber and the first process chamber 120 and second process chamber 130 and/or between the first process chamber 120 and the second process chamber 130.

In addition to the process chambers 120 and 130, processing system 900 can further include rear process chamber 950. Rear process chamber 950 can be disposed at a rear side of processing system 900. For instance, rear process chamber 950 can be disposed at a side of transfer chamber 115 that is opposite loadlock chamber 114. As one example, first process chamber 120 can be disposed on a first side of the transfer chamber 115 and second process chamber 130 can be disposed on a second side of the transfer chamber 115 that is opposite the first side. The rear process chamber 950 can be disposed on a third side (e.g., the rear side) that is perpendicular to the first side and the second side. The loadlock chamber 114 can thus be disposed on a fourth side (e.g., a front side) that is opposite the third side. In some embodiments, only a single processing station 952 may be included in rear process chamber 950. In addition, a single slit door 953 may be included at rear process chamber 950 to allow workpiece handling robot 150 to transfer workpieces to and/or from processing station 952.

A motion of the workpiece handling robot 150 to transfer workpieces at processing station 952 may be similar to and/or identical to a motion used to transfer workpieces to and/or from workpiece column 110 (e.g., as depicted in FIG. 8A). For instance, the workpiece handling robot may be configured to access a rear process chamber having only one processing station in addition to being configured to access other process chambers having two processing stations.

In this way, a footprint of the processing system 900 can be reduced while achieving an extra processing station 952. For instance, the rear process chamber 950 can provide an additional processing station 952 (e.g., compared to, for example, processing system 100 of FIG. 1) without requiring an increased width of the entire processing system 900 to accommodate, for instance, two processing stations at a rear of the processing system 900.

Figure 10:
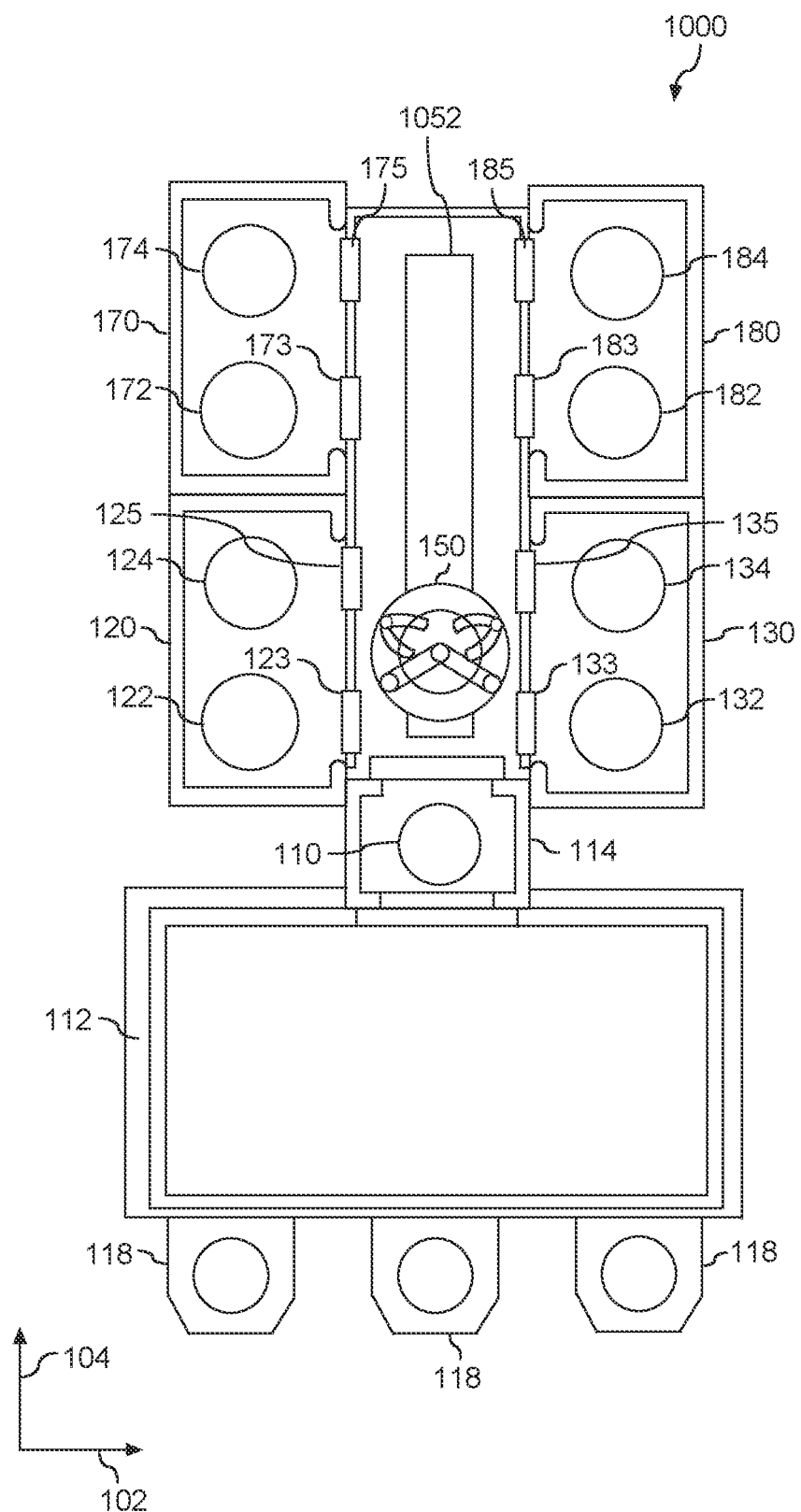
FIG. 10 depicts a plan view of an example processing system according to example embodiments of the present disclosure.

FIG. 10 depicts a plan view of an example processing system 1000 according to example embodiments of the present disclosure. Similar to the processing system 100 of FIG. 1, the processing system 1000 of FIG. 10 can include a front end portion 112, a loadlock chamber 114, a transfer chamber 115 and a plurality of process chambers, including a first process chamber 120 and a second process chamber 130. The system can include a workpiece handling robot 150 for transferring workpieces to and from the workpiece column 110 in the loadlock chamber and the first process chamber 120 and second process chamber 130 and/or between the first process chamber 120 and the second process chamber 130. Additionally, similarly to the processing system 400 of FIG. 4, the processing system 1000 of FIG. 10 can include third process chamber 170 and fourth process chamber 180.

As illustrated in FIG. 10, the third process chamber 170 and the fourth process chamber 180 are disposed in an adjacent linear arrangement to first process chamber 120 and second process chamber 130, respectively, such as without a break in transfer chamber 115. For instance, in the embodiment of FIG. 10, the workpiece column 160 and transfer position 162 of processing system 400 of FIG. 4 are removed. This can reduce a footprint of the processing system 1000. Additionally, the process chambers 120, 130, 170, and/or 180 can be aligned along a straight side. For instance, process chamber 120 can be aligned with process chamber 170 along a straight side. Additionally and/or alternatively, process chamber 130 can be aligned with process chamber 180 along a straight side.

Thus, to interface with the third process chamber 170 and/or fourth process chamber 180, the workpiece handling robot 150 can be linearly movable within transfer chamber 115. For instance, the workpiece handling robot 150 can be repositioned along track 1052. In some embodiments, the workpiece handling robot 150 can be movable to at least a first position along track 1052. When the workpiece handling robot 150 is in the first position, the workpiece handling robot 150 can be configured to access first process chamber 120 and second process chamber 130. For instance, in some embodiments, the first position can be at a lateral center of the process chamber(s) 120 and/or 130. Additionally and/or alternatively, the workpiece handling robot 150 can be movable to at least a second position along track 1052. When the workpiece handling robot 150 is in the second position, the workpiece handling robot 150 can be configured to access the third process chamber 170 and the fourth process chamber 180. For instance, in some embodiments, the second position can be at a lateral center of the process chamber(s) 170 and/or 180.

Figure 11:
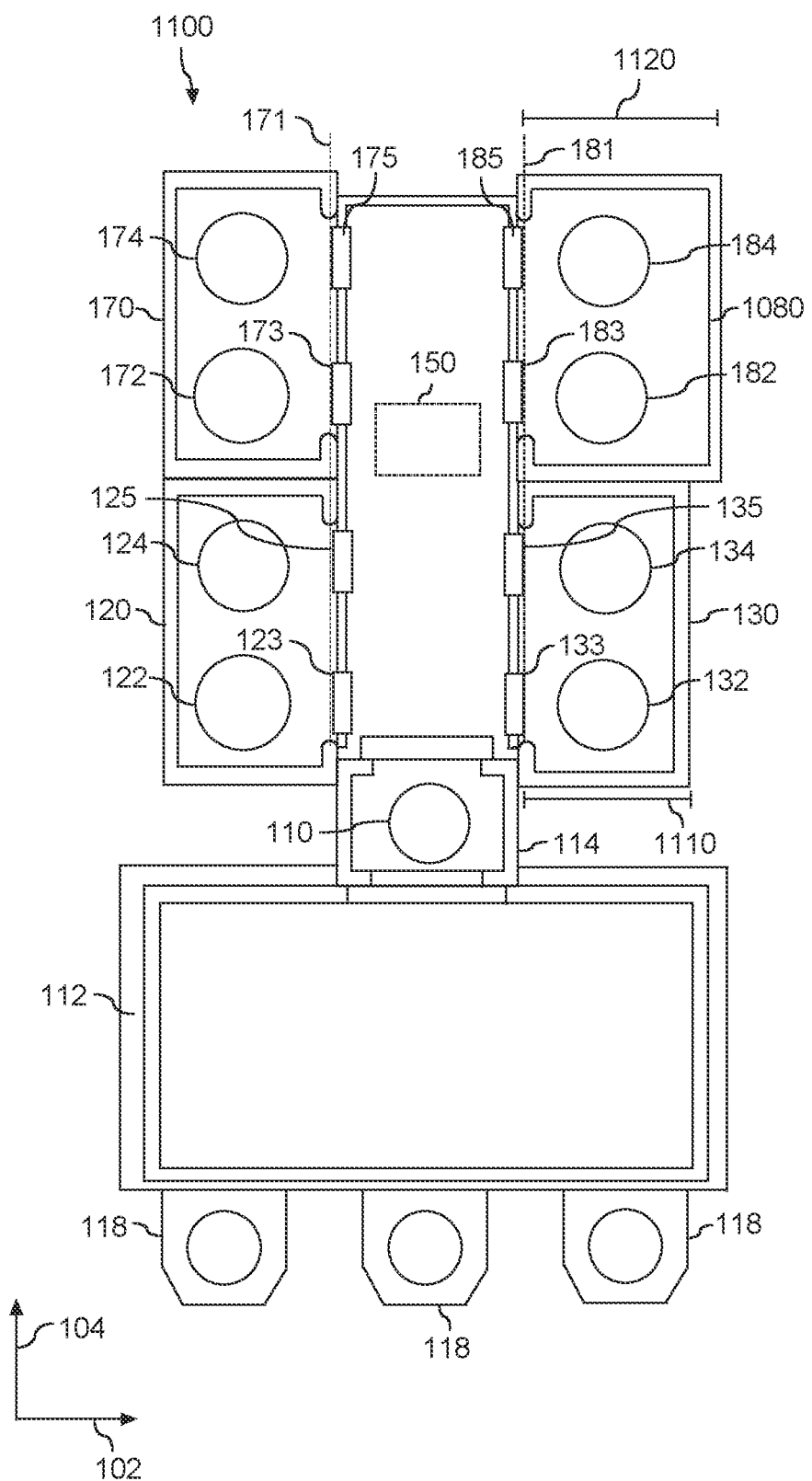
FIG. 11 depicts a plan view of an example processing system according to example embodiments of the present disclosure.

FIG. 11 depicts a plan view of an example processing system 1100 according to example embodiments of the present disclosure. Similar to the processing system 100 of FIG. 1, the processing system 1100 of FIG. 11 can include a front end portion 112, a loadlock chamber 114, a transfer chamber 115 and a plurality of process chambers, including a first process chamber 120 and a second process chamber 130. The system can include a workpiece handling robot 150 for transferring workpieces to and from the workpiece column 110 in the loadlock chamber and the first process chamber 120 and second process chamber 130 and/or between the first process chamber 120 and the second process chamber 130. Additionally, similarly to the processing system 400 of FIG. 4, the processing system 1100 of FIG. 11 can include third process chamber 170 and fourth process chamber 180. The process chambers 170 and 180 can be arranged similar to FIG. 4 and/or FIG. 10. For instance, a single workpiece handling robot 150 may be movable to access both process chambers 120, 130 and 170, 180, as described with respect to FIG. 10. Additionally and/or alternatively, a second workpiece handling robot and/or a transfer position may be used to access the process chambers 170, 180, as described with respect to FIG. 4.

As illustrated in FIG. 11, a depth 1110 of process chamber 130 can be different from a depth 1120 of process chamber 1080. For instance, in some cases, different types, capacities, etc. of process chambers can result in the process chambers having disparate depths. It can be desirable for a process chamber to provide a consistent interface for workpiece handling robot 150, such that the workpiece handling robot 150 can operate similarly and/or identically at each process chamber. Thus, according to example embodiments of the present disclosure, the process chamber 130 and process chamber 1080 can be aligned along a straight edge 181. As illustrated, this causes a depth of process chamber 180 to extend farther than process chamber 130. However, this provides that slit doors 133, 135 and 183, 185 are aligned along the straight side 181. Thus, a workpiece handling robot 150 can access the slit doors 133, 135 and 183, 185 that are aligned along the straight side 181.

Figure 12A:
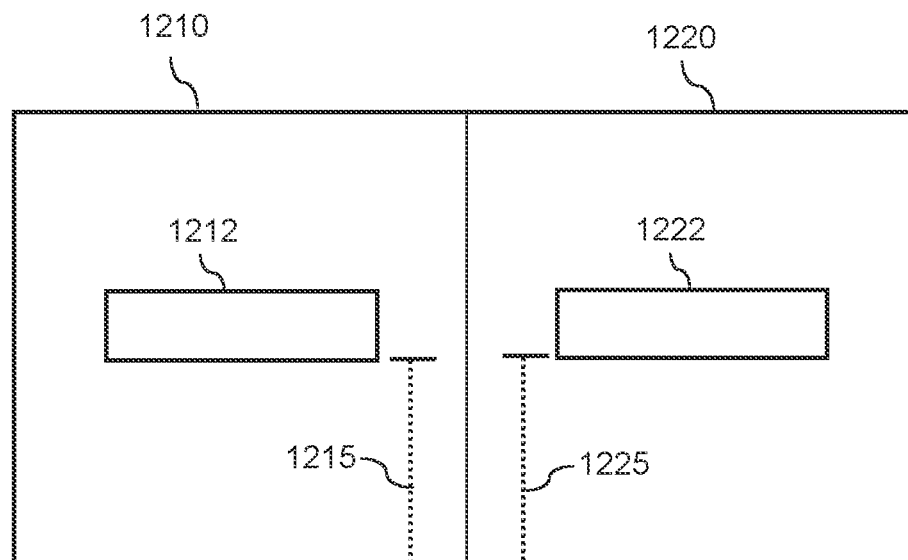
FIGS. 12A and 12B depict example aligned slit doors according to example embodiments of the present disclosure.
Figure 12B:
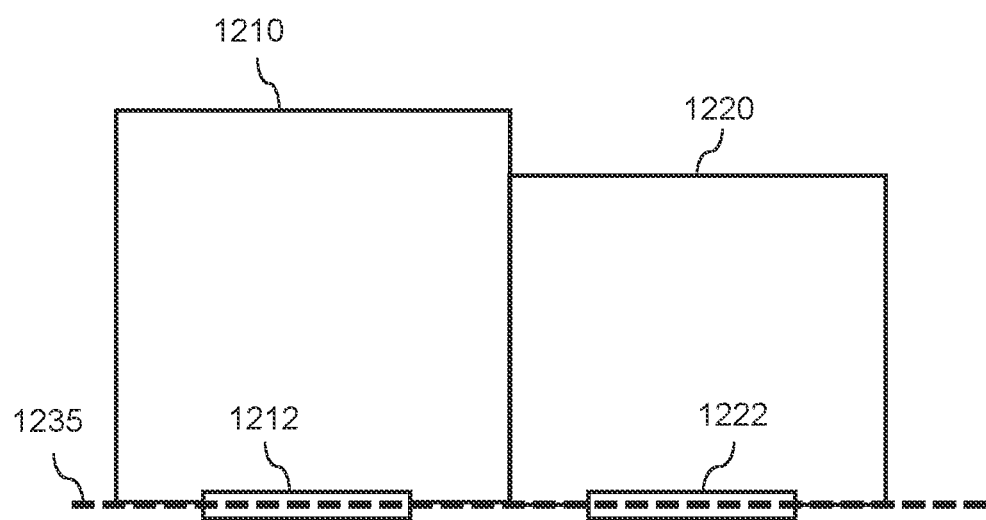

FIGS. 12A and 12B depict example aligned slit doors according to example embodiments of the present disclosure. For instance, FIG. 12A depicts a front profile view of first process chamber 1210 and second process chamber 1220. FIG. 12A illustrates that a slit door 1212 of first process chamber 1210 and a slit door 1222 of second process chamber 1220 can be vertically aligned. The process chambers 1210 and 1220 are depicted as having one slit door for the purposes of illustration. It should be understood that the process chambers described herein may have any suitable number of slit doors, such as two slit doors, according to example aspects of the present disclosure.

As illustrated in FIG. 12A, a vertical offset 1215 between a point on slit door 1212 and a bottom of the process chamber(s) 1210, 1220 can be identical or about identical (e.g., within about 10%) to a vertical offset 1222 between a similar point on slit door 1222 and the bottom. FIG. 12A illustrates this point as being a bottom of slit doors 1212, 1222. It should be understood that any suitable point can be used as comparison, such as a center, top, etc.

Additionally, FIG. 12B depicts a top profile view of first process chamber 1210 and second process chamber 1220. FIG. 12B illustrates that the slit doors 1212 and 1222 can be laterally aligned, such as aligned along straight side 1235. For instance, a lateral offset between slit doors 1212 and 1222 can be about zero such that a plane defined by straight side 1235 contains slit doors 1212 and 1222. As illustrated in FIG. 12B, first process chamber 1210 has a greater depth than second process chamber 1220. In this way, a front side of first process chamber 1210 and second process chamber 1220 can be aligned as straight side 1235 while the back sides of each process chamber 1210, 1220 may be non-aligned.

Figure 13:
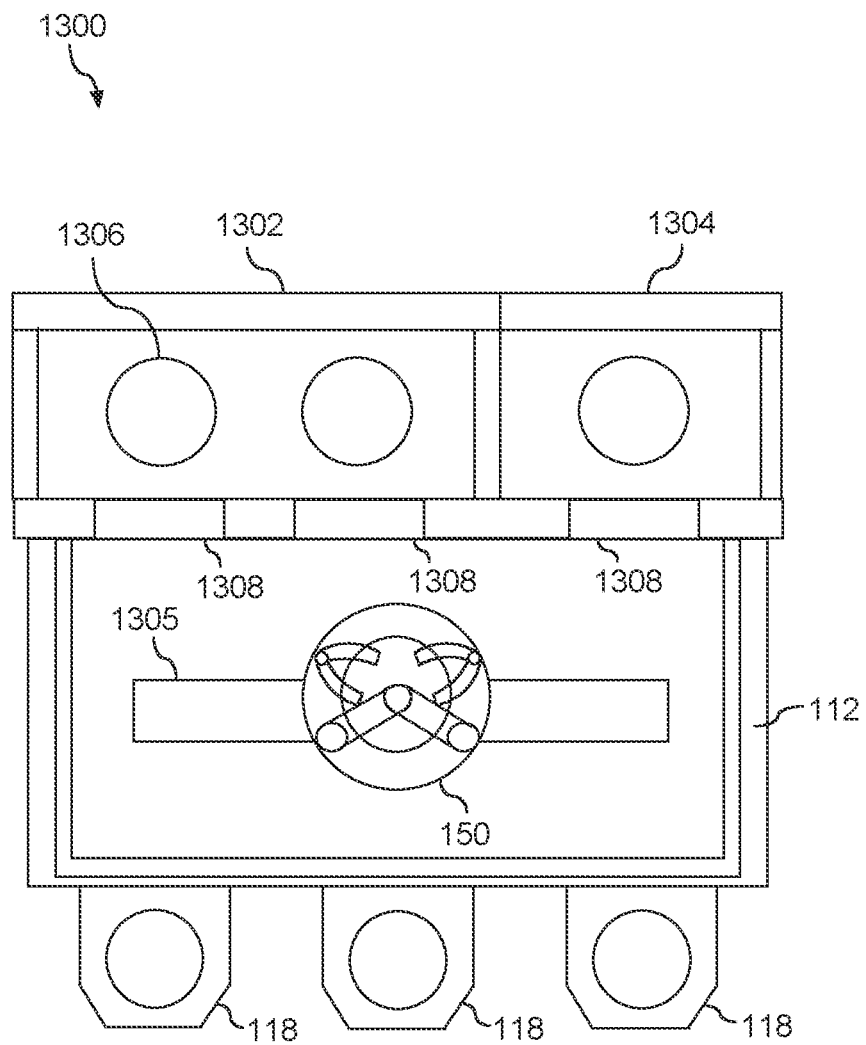
FIG. 13 depicts a plan view of an example processing system according to example embodiments of the present disclosure.

FIG. 13 depicts a plan view of an example processing system 1300 according to example embodiments of the present disclosure. Similar to the processing system 100 of FIG. 1, the processing system 1300 of FIG. 13 can include a front end portion 112 configured to engage and/or receive workpieces from one or more workpiece input devices 118. As depicted in the processing system 1300 of FIG. 13, the front end portion 112 may be placed in direct workpiece communication (e.g., by a single workpiece handling robot 150) with the workpiece input devices 118 and one or more process chambers and/or processing stations 1306, such as first process chamber 1302 and/or second process chamber 1304 (e.g., without requiring a loadlock chamber and/or a transfer chamber). For instance, workpiece handling robot 150 can be navigated along track 1305 to transfer workpieces between processing stations 1306 and/or workpiece input devices 118.

As illustrated in FIG. 13, the process chambers (e.g., 1302 and/or 1304) may have any suitable number of processing stations 1306. For instance, first process chamber 1302 may have two processing stations 1306 and second process chamber 1304 may have only one processing station 1306. Each processing station 1306 can have an associated slit door 1308. When processing workpieces in the processing stations 1306, the slit doors 1308 of a process chamber may be sealed to allow for a condition difference between the process chamber and the front end portion 112. For instance, the front end portion 112 may be maintained at atmospheric conditions (e.g., pressure, temperature) while pressure inside a process chamber (e.g., 1302, 1304) performing processing may be adjusted from atmospheric conditions (e.g., to a process pressure and/or temperature).

Figure 14:
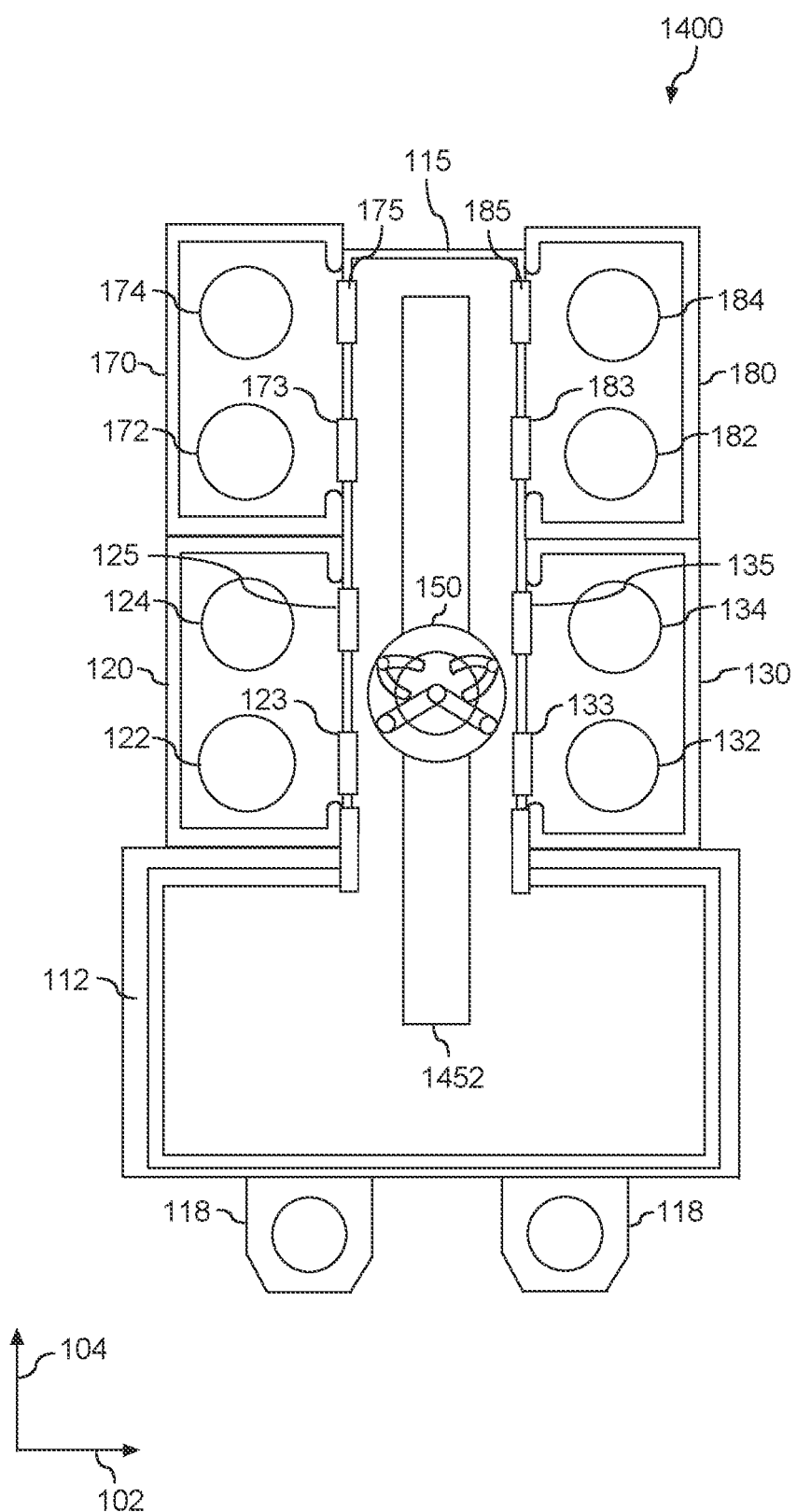
FIG. 14 depicts a plan view of an example processing system according to example embodiments of the present disclosure.

FIG. 14 depicts a plan view of an example processing system 1400 according to example embodiments of the present disclosure. Similar to the processing system 1000 of FIG. 10, the processing system 1400 of FIG. 14 can include a front end portion 112, a transfer chamber 115, and a plurality of process chambers, including a first process chamber 120, a second process chamber 130, a third process chamber 170, and a fourth process chamber 180. As illustrated in FIG. 14, the transfer chamber 115 and the front end portion 112 can be a same chamber (e.g., share one or more walls, share environmental conditions, etc.). A (e.g., single) workpiece transfer robot 150 can be configured to transfer workpieces between the workpiece input devices 118 and the process chamber(s) (e.g., 120, 130, 170, 180). For instance, the workpiece transfer robot 150 can be navigated along track 1452 to transfer workpieces to and/or from the process chambers (e.g., 120, 130, 170, 180) and/or from the workpiece input devices 118. When processing workpieces in the processing stations (e.g., 122, 124), the slit doors (e.g., 123, 125) of a process chamber (e.g., 120) may be sealed to allow for a condition difference between the process chamber (e.g., 120) and the front end portion 112 and/or transfer chamber 115. For instance, the front end portion 112 and/or transfer chamber 115 may be maintained at atmospheric conditions (e.g., pressure, temperature) while pressure inside a process chamber (e.g., 120) performing processing may be adjusted from atmospheric conditions (e.g., to a process pressure and/or temperature).

Figure 15:
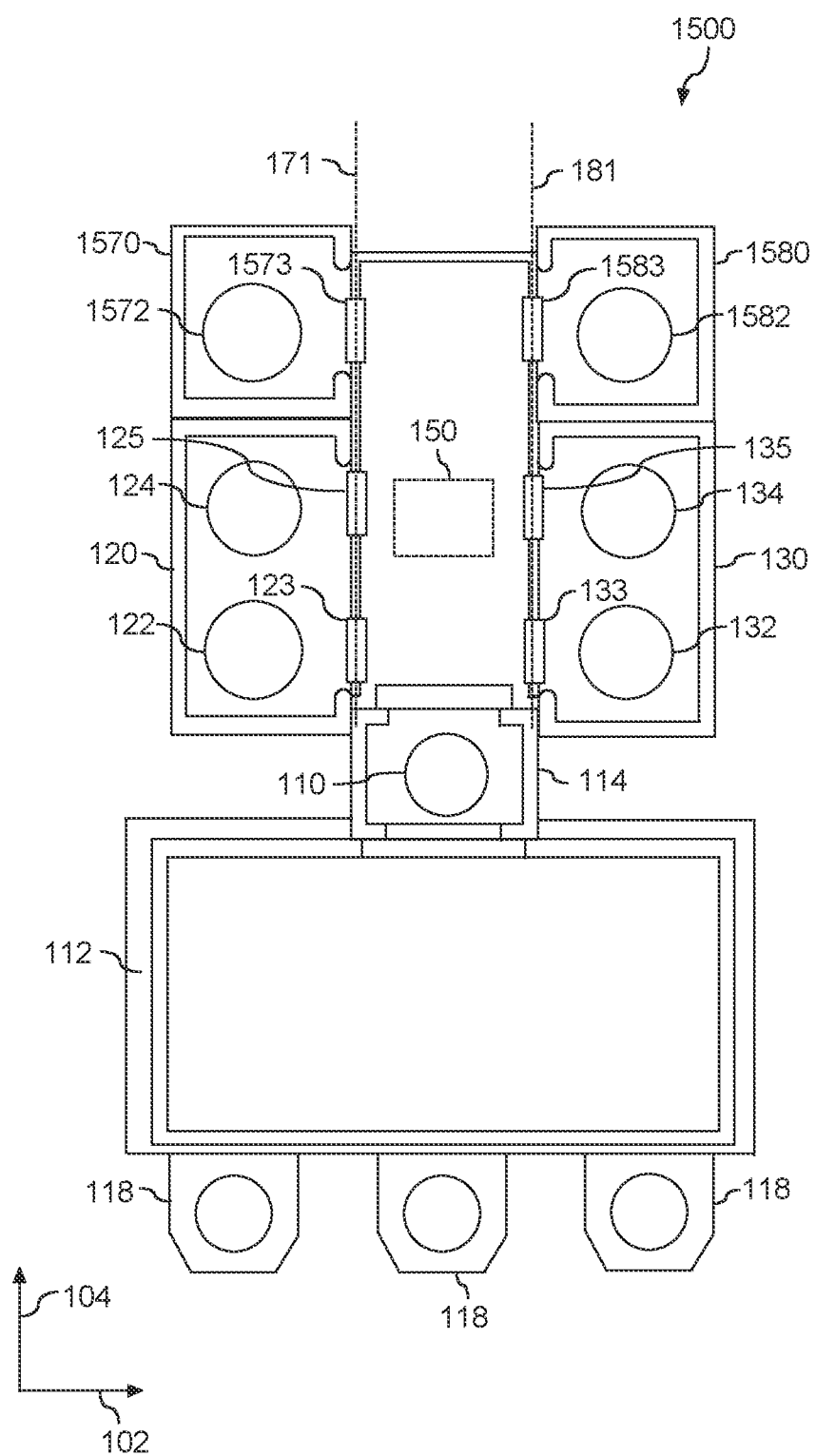
FIG. 15 depicts a plan view of an example processing system according to example embodiments of the present disclosure.

FIG. 15 depicts a plan view of an example processing system 1500 according to example embodiments of the present disclosure. Similar to the processing system 100 of FIG. 1, the processing system 1500 of FIG. 15 can include a front end portion 112, a loadlock chamber 114, a transfer chamber 115 and a plurality of process chambers, including a first process chamber 120 and a second process chamber 130. The system can include a workpiece handling robot 150 for transferring workpieces to and from the workpiece column 110 in the loadlock chamber and the first process chamber 120 and second process chamber 130 and/or between the first process chamber 120 and the second process chamber 130. The workpiece handling robot 150 can be any suitable workpiece handling robot as described herein, such as workpiece handling robot systems including one robot, two robots, loadlock chambers, no loadlock chambers, etc. As illustrated in FIG. 15, a process chamber as described herein can include any suitable number of processing stations and/or slit doors. For example, while process chambers 120 and 130 each include two processing stations and respective slit doors, processing system 1500 can additionally include process chamber 1570 and process chamber 1580 each having a single processing station 1572, 1582 and associated slit door 1573, 1583. As illustrated in FIG. 15, the process chambers 1570 and 1580 may be disposed across from each other across transfer chamber 115. However, any suitable arrangement of process chambers can be employed in accordance with example aspects of the present disclosure.

Figure 16:
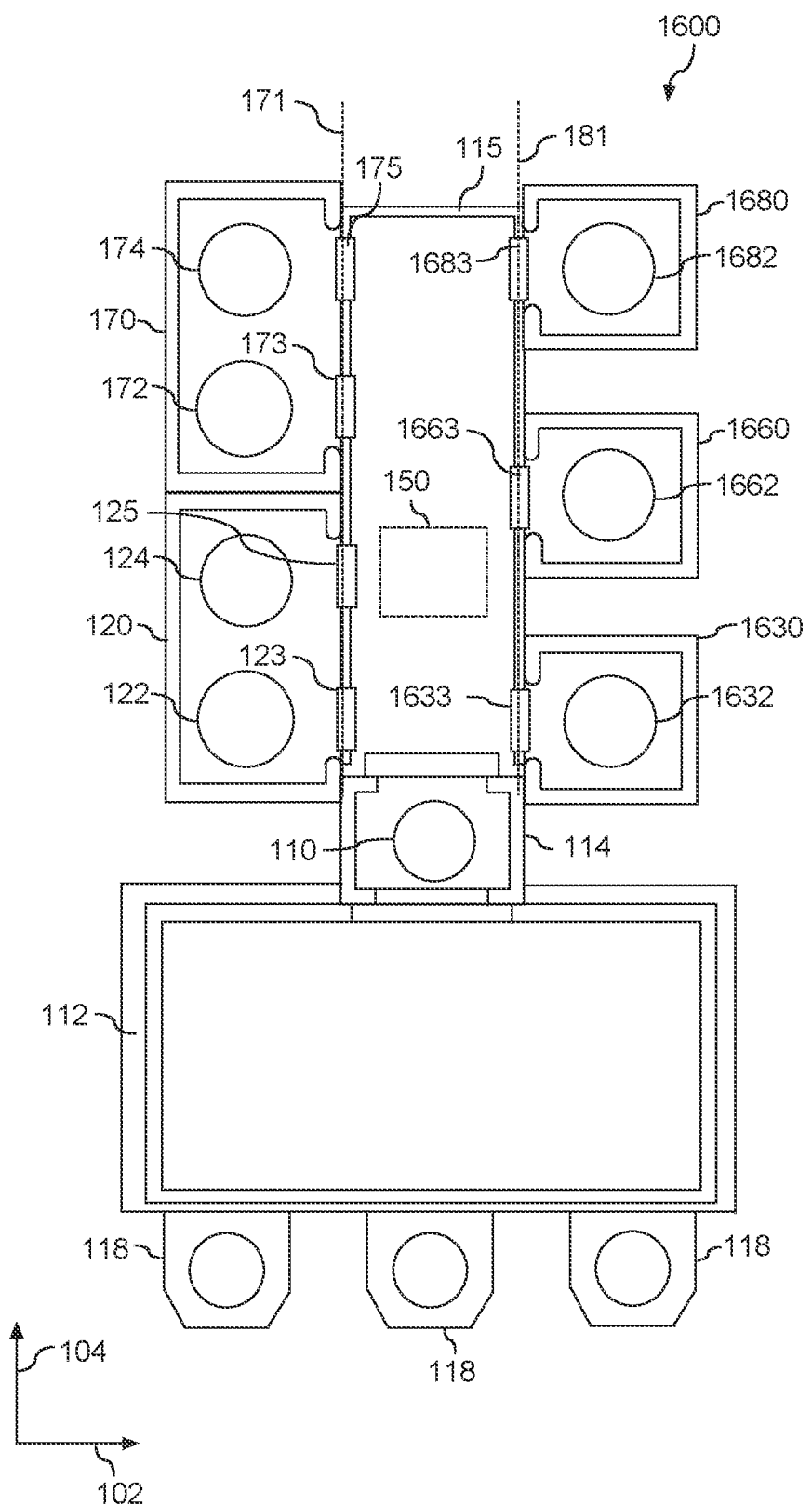
FIG. 16 depicts a plan view of an example processing system according to example embodiments of the present disclosure.

FIG. 16 depicts a plan view of an example processing system 1600 according to example embodiments of the present disclosure. Similar to the processing system 100 of FIG. 1, the processing system 1600 of FIG. 16 can include a front end portion 112, a loadlock chamber 114, a transfer chamber 115 and a plurality of process chambers, including a first process chamber 120 and a second process chamber 170. The system can include a workpiece handling robot 150 for transferring workpieces to and from the workpiece column 110 in the loadlock chamber and the first process chamber 120 and second process chamber 170 and/or between the first process chamber 120 and the second process chamber 170. The workpiece handling robot 150 can be any suitable workpiece handling robot as described herein, such as workpiece handling robot systems including one robot, two robots, loadlock chambers, no loadlock chambers, etc. As illustrated in FIG. 16, a process chamber as described herein can include any suitable number of processing stations and/or slit doors. For example, while process chambers 120 and 130 each include two processing stations and respective slit doors, processing system 1600 can additionally include process chamber 1670, process chamber 1680, and process chamber 1690 each having a single processing station 1672, 1682, 1692 and associated slit door 1673, 1683, 1693. As illustrated in FIG. 16, the process chambers having a single processing station (e.g., 1670, 1680, and 1690) may be disposed on an opposite side of transfer chamber 115 from the process chambers having two processing stations (e.g., 120, 170). However, any suitable arrangement of process chambers can be employed in accordance with example aspects of the present disclosure.

The above examples of operation of the workpiece handling robot for transferring workpieces in a processing system are provided for purposes of illustration and discussion. Those of ordinary skill in the art, using the disclosures provided herein, will understand that many different modes of operating the workpiece handling robot can be used without deviating from the scope of the present disclosure.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A processing system for processing a plurality of workpieces, the processing system comprising:
   a transfer chamber in process flow communication with a first process chamber and a second process chamber, the transfer chamber having a first straight side;
   wherein the first process chamber comprises at least one first processing station, and wherein the first processing chamber is disposed along the first straight side;
   wherein the second process chamber comprises at least two second processing stations, wherein the second processing chamber is disposed along the first straight side, and wherein the second process chamber disposed in linear arrangement with the first process chamber along the first straight side, the first process chamber having a first depth that is different from a second depth of the second process chamber; and
   wherein the transfer chamber comprises at least one workpiece handling robot configured to transfer at least one workpiece of the plurality of workpieces to the at least one first processing station and the at least two second processing stations.

2. The processing system of claim 1, wherein the first process chamber comprises at least one first slit door disposed along the first straight side and the second process chamber comprises at least one second slit door disposed along the first straight side, and wherein the at least one first slit door is laterally aligned with the at least one second slit door along the first straight side.

3. The processing system of claim 2, wherein a vertical offset between a vertical center of the at least one first slit door and a vertical center of the at least one second slit door is about identical.

4. The processing system of claim 1, further comprising a loadlock chamber in process communication with the transfer chamber, the loadlock chamber comprising a workpiece column.

5. The processing system of claim 4, wherein the loadlock chamber is disposed on a side of the transfer chamber that is perpendicular to the first straight side.

6. The processing system of claim 1, wherein the first process chamber comprises at least two processing stations.

7. The processing system of claim 1, wherein the first process chamber, the second process chamber, and the transfer chamber are in process flow communication without vacuum break.

8. The processing system of claim 1, further comprising a transfer position between the first process chamber and the second process chamber, wherein the transfer position comprises at least one workpiece column and wherein the transfer position is located within the transfer chamber.

9. The processing system of claim 1, further comprising a third process chamber comprising at least one processing station and a fourth process chamber comprising at least one processing station, the third process chamber and the fourth process chamber disposed on a third straight side of the transfer chamber, the third straight side disposed opposite the first straight side of the transfer chamber.

10. The processing system of claim 9, wherein at least one of the third process chamber or the fourth process chamber comprises at least two processing stations.

11. The processing system of claim 1, further comprising a front end portion, wherein the front end portion is in process flow communication with the transfer chamber.

12. A processing system for processing a plurality of workpieces, the processing system comprising:
   a first process chamber having two processing stations;
   a second process chamber having two processing stations;
   a third process chamber having one processing station;
   a loadlock chamber having one or more workpiece columns;
   a transfer chamber in process flow communication with the first process chamber, the second process chamber, and the third process chamber; and
   a workpiece handling robot configured to transfer at least one workpiece to the processing stations of the first process chamber, the second process chamber, or the third process chamber;
   wherein the first process chamber is disposed on a first side of the transfer chamber;
   wherein the second process chamber is disposed on a second side of the transfer chamber, the second side of the transfer chamber being opposite the first side of the transfer chamber;
   wherein the third process chamber is disposed on a third side of the transfer chamber, the third side of the transfer chamber being perpendicular to the first side and the second side of the transfer chamber;

wherein the loadlock chamber is disposed on a fourth side of the transfer chamber, the fourth side of the transfer chamber is opposite from the third side;

wherein the workpiece handling robot comprises at least two robot arms configured to simultaneously extend a first robot arm into the workpiece column to grab a first workpiece in a first workpiece position and a second robot arm into the workpiece column to grab a second workpiece in a second workpiece position at a different height in the workpiece column from the first workpiece position, the workpiece handling robot configured to transfer the first workpiece and second workpiece to each of the two processing stations in the first process chamber, the second process chamber, or the third process chamber.

13. The processing system of claim 12, further comprising a front end portion, wherein the front end portion is in process flow communication with the transfer chamber.

14. A processing system for processing a plurality of workpieces, the processing system comprising:
a first process chamber having at least one processing station;
a second process chamber having at least two processing stations;
a frond end portion in process flow communication with the first process chamber and the second process chamber;
one or more workpiece input devices; and
one or more workpiece handling robots;
wherein the first process chamber and the second process chamber are disposed on a first straight side of the front end portion,
wherein the one or more workpiece input devices are disposed on a second straight side of the front end portion, the second straight side being parallel to the first straight side of the front end portion,
wherein the workpiece handling robot comprises at least two robot arms configured to simultaneously extend a first robot arm into the workpiece input device to grab a first workpiece in a first workpiece position and a second robot arm into the workpiece input device to grab a second workpiece in a second workpiece position at a different height in the workpiece input device from the first workpiece position, the workpiece handling robot configured to transfer the first workpiece and second workpiece to each of the two processing stations in the first process chamber or the second process chamber.

15. The processing system of claim 14, wherein the at least one workpiece handling robot is linearly movable along a horizontal direction within the front end portion, the horizontal direction being parallel to the first straight side of the front end portion.

16. The processing system of claim 14, wherein the at least one workpiece transfer robot is linearly movable along a vertical direction within the transfer chamber, the vertical direction being perpendicular to the first straight side of the front end portion.

17. The processing system of claim 14, wherein the workpiece handling robot is configured to transfer the first workpiece to one of the processing stations in the first process chamber and transfer the second workpiece to one of the processing stations in the second process chamber.

18. The processing system of claim 14, wherein no loadlock chambers are disposed in process flow communication between the workpiece input device and the first or second process chambers.

19. The processing system of claim 1, wherein the workpiece handling robot comprises at least two robot arms configured to simultaneously extend a first robot arm into a workpiece column to grab a first workpiece in a first workpiece position and a second robot arm into the workpiece column to grab a second workpiece in a second workpiece position at a different height in the workpiece column from the first workpiece position.

20. The processing system of claim 19, wherein the workpiece handling robot is configured to transfer the first workpiece to the processing station in the first process chamber and the second workpiece to a processing station in the second process chamber.

* * * * *